US009354673B2

(12) United States Patent
Sakakibara et al.

(10) Patent No.: US 9,354,673 B2

(45) Date of Patent: May 31, 2016

(54) PORTABLE TYPE ELECTRONIC DEVICE, PORTABLE TYPE ELECTRONIC DEVICE GROUP, AND METHOD OF MANUFACTURING PORTABLE TYPE ELECTRONIC DEVICE

(75) Inventors: Kenji Sakakibara, Tokyo (JP); Hiroaki Masuda, Tochigi (JP); Yu Togasaki, Kanagawa (JP); Kiyokazu Miyazawa, Kanagawa (JP); Kazuto Nakagawa, Kanagawa (JP)

(73) Assignees: SONY CORPORATION, Tokyo (JP); SONY INTERACTIVE ENTERTAINMENT INC., Tokyo (JP)

(*) Notice: Subject to any disclaimer, the term of this patent is extended or adjusted under 35 U.S.C. 154(b) by 259 days.

(21) Appl. No.: 14/117,515

(22) PCT Filed: May 31, 2012

(86) PCT No.: PCT/JP2012/064242

§ 371 (c)(1), (2), (4) Date: Nov. 13, 2013

(87) PCT Pub. No.: WO2012/165603

PCT Pub. Date: Dec. 6, 2012

(65) Prior Publication Data

US 2015/0085435 A1 Mar. 26, 2015

(30) Foreign Application Priority Data

Jun. 3, 2011 (JP) ................................ 2011-125867
Jun. 3, 2011 (JP) ................................ 2011-125869
Jun. 3, 2011 (JP) ................................ 2011-125871
Jun. 3, 2011 (JP) ................................ 2011-125874

(51) Int. Cl.
*H05K 7/00* (2006.01)
*H05K 5/00* (2006.01)

(Continued)

(52) U.S. Cl.
CPC .............. *G06F 1/1698* (2013.01); *A63F 13/06* (2013.01); *A63F 13/08* (2013.01); *G06F 1/1658* (2013.01);

(Continued)

(58) Field of Classification Search
CPC .................................. H01Q 1/22; H01Q 1/00
USPC .............. 361/679.01–679.03, 679.27, 679.56
See application file for complete search history.

(56) References Cited

U.S. PATENT DOCUMENTS

2001/0053672 A1* 12/2001 Masaki .................... H01Q 1/22 455/575.7
2002/0118175 A1* 8/2002 Liebenow ............ G06F 1/1626 345/168

(Continued)

FOREIGN PATENT DOCUMENTS

CN 101079517 11/2007
EP 2 065 970 6/2009

(Continued)

OTHER PUBLICATIONS

Translation of International Preliminary Report on Patentability dated Dec. 4, 2013 from corresponding Application No. PCT/JP2012/064242.

(Continued)

*Primary Examiner* — Jerry Wu

(74) *Attorney, Agent, or Firm* — Katten Muchin Rosenman LLP

(57) ABSTRACT

A first antenna (31) is disposed closer to a rear touch panel (4) than to a display panel (**2*a*) in the front-rear direction of a housing (20). The first antenna (31) is disposed so as to be offset with respect to the rear touch panel (4) in a direction perpendicular to the front-rear direction of the housing (20) so that at least a part of the first antenna (31) does not overlap the rear touch panel (4) in the front-rear direction of the housing (20**). With such a structure, the display panel and touch panel are provided at the front surface and rear surface, respectively, and good reception sensitivity can be obtained.

7 Claims, 14 Drawing Sheets

(51) Int. Cl.

| | |
|---|---|
| ***G06F 1/16*** | (2006.01) |
| ***H04M 1/02*** | (2006.01) |
| ***A63F 13/90*** | (2014.01) |
| ***A63F 13/20*** | (2014.01) |
| *H05K 1/14* | (2006.01) |
| *H05K 1/18* | (2006.01) |

(52) U.S. Cl.

CPC ........ *H04M 1/026* (2013.01); *A63F 2300/1043* (2013.01); *A63F 2300/1068* (2013.01); *A63F 2300/204* (2013.01); *H04M 2250/22* (2013.01); *H05K 1/14* (2013.01); *H05K 1/18* (2013.01)

(56) References Cited

U.S. PATENT DOCUMENTS

| | | | |
|---|---|---|---|
| 2007/0202956 | A1 | 8/2007 | Ogasawara et al. |
| 2010/0020034 | A1 | 1/2010 | Kim |

FOREIGN PATENT DOCUMENTS

| | | |
|---|---|---|
| JP | 10-308580 | 11/1998 |
| JP | 2004297251 | 10/2004 |
| JP | 2008199230 | 8/2008 |
| JP | 2010-239211 | 10/2010 |
| JP | 2012-152357 | 8/2012 |

OTHER PUBLICATIONS

Sekkei Chotatsu Dankai kara Hendo ni Sonaeyo, Nikkei information strategy Apr. 2010, Feb. 27, 2010, vol. 19, No. 3, pp. 047-049. See International Search Report dated Sep. 11, 2012 from the corresponding PCT/JP2012/064242.

Shin'ichi Miyazaki, PlayStation Vita o Bunkai shitemita. Naibu Kozo ni Processor nado, kini naru Tokoro o Shashin de Check, Aetas, Inc., Dec. 17, 2011. See International Search Report dated Sep. 11, 2012 from the corresponding PCT/JP2012/064242.

International Search Report dated Sep. 11, 2012 from the corresponding PCT/JP2012/064242.

European search report dated Nov. 25, 2014 from corresponding Application No. 12793060.0.

Japanese Notification of Reasons for Refusal dated Jan. 20, 2015 from corresponding Application No. 2011-125871.

Chinese First Office Action dated Feb. 4, 2015 from corresponding Application No. 201280025566.9.

* cited by examiner 5
22a
7a
7b
7
10
14
42
40
41
2
21b
22
24
21
43
X2
Z1
Z2
X1
15
6
22b
8a
8b
8

10
15
23j
23f
23
IV
IV
33
4
11
34
31
12
14
32
X1
X2
Z1
Z2

10
14
15
5c
5d
6c
6d
7c
8c
21
21b
21c
21d
20
23
24
40
41
42
42c
43
43a
50
56
56a
56b
56c
61
70
82
83
85
23j
23f
12
3
Y1
X1
Z1
Z2
X2
Y2

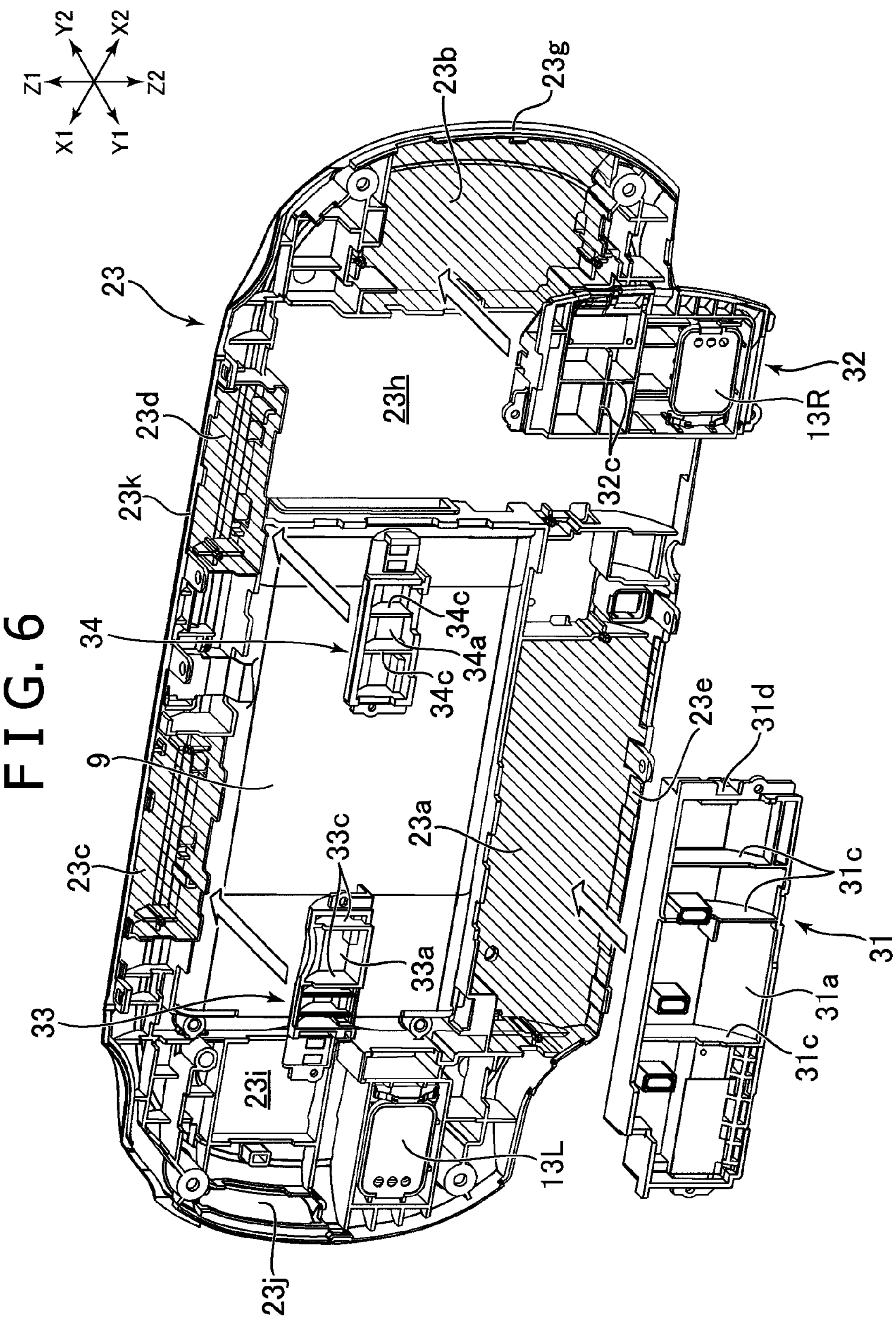
F I G. 6
Y2
X2
Z1
Z2
X1
Y1
23b
23g
23
23h
32
13R
32c
23d
23k
34
34c
34a
34c
9
23e
31d
23a
23c
33c
31c
31
33a
31a
33
31c
23i
13L
23j (a)

(b)

(c)

56
43c
43
43a
83b
83d
83
85a
83c
83a
85a
85
82b
82d
82
31
40
82c
82a
C
41
41a
50
84a
81b
81d
84
W6
84c
42e
41e
42
42a
81c
81a
42c
32
W5
X1
X2
Z1
Z2

110
15
6d
6c
21b
8c
24
21d
21d
21
21c
14
5d
21d
5c
7c
43
43a
83
85
82
41
123
23f
81
84
42
40
42c
12
3
Y1
X1
Z1
Z2
X2
Y2

123
123b
13R
23d
9
123h
23c
123a
13L
123j

PORTABLE TYPE ELECTRONIC DEVICE, PORTABLE TYPE ELECTRONIC DEVICE GROUP, AND METHOD OF MANUFACTURING PORTABLE TYPE ELECTRONIC DEVICE

TECHNICAL FIELD

The present invention relates to a portable type electronic device, a portable type electronic device group, and a method of manufacturing the portable type electronic device.

BACKGROUND ART (1) Conventionally, portable type electronic devices capable of wireless communication using a mobile telephone network and wireless communication using a wireless LAN have been used. Electronic devices of this type include an antenna (see for example US 2007/0,202,956 A1).

(2) In addition, inside a portable type electronic device, an IC chip mounted on a circuit board and other electronic parts included in the electronic device may be connected to each other via a cable.

(3) In addition, as disclosed in US 2007/0,202,956 A1, portable type electronic devices having a wireless communication function have been conventionally used. The frequencies of radio waves used in wireless communication have recently been increased. It is desired that electronic devices handling high-frequency signals have a large ground, and that the impedance thereof be low. A conventional portable type electronic device has one circuit board coinciding substantially in size with a housing, and a ground layer is formed in the circuit board. According to such a structure, a large and low-impedance ground can be obtained.

(4) Further, an electronic device of US 2007/0,202,956 A1 has a display screen in a front surface, and has operating members that can be operated by a user on the left and right of the display screen. This electronic device has a communicating function using a wireless LAN.

SUMMARY (1) The applicant is considering a portable type electronic device having a display panel in a front surface and having a touch panel in a rear surface. A large distance between such panels and an antenna is desirable for reception sensitivity of the antenna. In a mode of the present invention, a portable type electronic device includes: a housing; a display panel disposed on a front surface side of the housing; a rear touch panel disposed on a back surface side of the housing; and an antenna housed in the housing. The antenna is disposed closer to the other panel from one panel of the display panel and the rear touch panel in a front-rear direction of the housing, and the antenna is located so as to be offset from the other panel in a direction perpendicular to the front-rear direction of the housing so that at least a part of the antenna does not overlap the other panel in the front-rear direction of the housing. According to this electronic device, both of an adverse effect from the display panel and an adverse effect from the rear touch panel on the reception sensitivity of the antenna can be reduced.

(2) For the miniaturization of the electronic device, a cable need to be disposed while a space within the electronic device is used effectively. However, because the cable usually has a surplus length, the position of the cable is not easily fixed within the electronic device. Therefore, when the cable is disposed in a narrow space within the electronic device, the cable and other parts tend to interfere with each other. In a mode of the present invention, an electronic device includes: a circuit board; an electronic part disposed on the circuit board; a cable disposed so as to straddle the electronic part; and a cable holder attached to the circuit board, the cable holder including a retaining portion for retaining the cable, the retaining portion being located on an opposite side of the electronic part from the circuit board. According to this electronic device, interference with other parts provided to the electronic device can be prevented while a space over the electronic part is used.

(3) When one circuit board coinciding in size with the housing in the electronic device is used, the following inconvenience may arise. For example, the number of layers possessed by a circuit board has recently been increasing with increase in multifunctionality of the electronic device. However, while a region in which a CPU and a GPU are mounted needs many layers, a relatively small number of layers may suffice for other regions. In addition, because an external force tends to act on a part of the circuit board, only that part may need to have a high strength. When the whole of one circuit board coinciding in size with the housing has multiple layers or a high-strength material is used for the whole of one circuit board in these cases, an inconvenience of an increase in cost and weight arises. In a mode of the present invention, a portable type electronic device includes: a first circuit board having a ground pattern on a surface; a second circuit board having a ground pattern on a surface, disposed so as to be adjacent to the first circuit board, and connected to the first circuit board through a cable including a signal line; and a metallic plate attached to the surface of the first circuit board and the surface of the second circuit board to electrically connect the ground patterns of the two boards to each other. According to this electronic device, ground impedance can be lowered while the plurality of circuit boards are used.

(4) Recently, portable type electronic devices having not only a communicating function using a wireless LAN but also a communicating function using a mobile telephone network have spread. However, while there are users who need these two communicating functions, there are users who need only the wireless LAN communicating function and consider the communicating function using the mobile telephone network to be unnecessary. In order to meet such demands of the users, the applicant is considering two kinds of portable type electronic devices that have a difference only in communicating functions and to which the arrangement, external shapes, and the like of operating members are common. However, when there are many parts not common to the two kinds of electronic devices in a case where such portable type electronic devices are manufactured, manufacturing cost thereof is increased.

(4-1) In a mode of the present invention, an electronic device includes: a circuit board; and a housing including a front housing covering a front side of the circuit board and provided with a display screen and an operating member and a back housing covering a back surface side of the circuit board. In addition, the electronic device includes: an antenna housed in the housing; a communication module housed in the housing and transmitting and receiving a signal through the antenna; and a receiving device housed in the housing, the receiving device receiving an IC card used for communication by the antenna and the communication module. The antenna, the communication module, and the receiving device are disposed between the back housing and the circuit board. According to this mode, the front housing can be made common in the portable type electronic device including the antenna, the communication module, and the receiving device and a portable type electronic device not including these parts, and thus manufacturing cost of these portable type electronic devices can be reduced.

(4-2) A portable type electronic device group according to a mode of the present invention includes a first portable type electronic device including a circuit board, a front housing covering a front side of the circuit board and provided with a display screen and an operating member, and a back housing covering a back side of the circuit board. The electronic device group also includes a second portable type electronic device including a circuit board, a front housing covering a front side of the circuit board and provided with a display screen and an operating member, and a back housing covering a back side of the circuit board, the second portable type electronic device not having a part of functions provided to the first portable type electronic device. The first electronic device has a plurality of parts for the part of the functions, the plurality of parts not being included in the second electronic device, and the plurality of parts are disposed between the back housing and the circuit board in the first electronic device. A structure of the front housing of the first electronic device and a structure of the front housing of the second electronic device are common to each other. According to this mode, the structure of the front housing is common in the first electronic device and the second electronic device. Thus, the manufacturing cost of these two electronic devices can be reduced.

(4-3) A manufacturing method according to a mode of the present invention is a method of manufacturing: a first portable type electronic device including a circuit board, a front housing covering a front side of the circuit board and provided with a display screen and an operating member, and a back housing covering a back side of the circuit board; and a second portable type electronic device including a circuit board, a front housing covering a front side of the circuit board and provided with a display screen and an operating member, and a back housing covering a back side of the circuit board, the second portable type electronic device not having a part of functions provided to the first electronic device. In this manufacturing method, a plurality of parts for the part of the functions, the plurality of parts not being included in the second electronic device, are disposed between the back housing and the circuit board in the first electronic device, and a housing common to the front housing of the second electronic device is used as the front housing of the first electronic device. According to this manufacturing method, the front housing is common in the first portable type electronic device and the second portable type electronic device. Thus, the manufacturing cost of these two electronic devices can be reduced.

BRIEF DESCRIPTION OF DRAWINGS

FIG. 6 is an exploded perspective view of a back housing and the antennas.

DESCRIPTION OF EMBODIMENT

Figure 1:
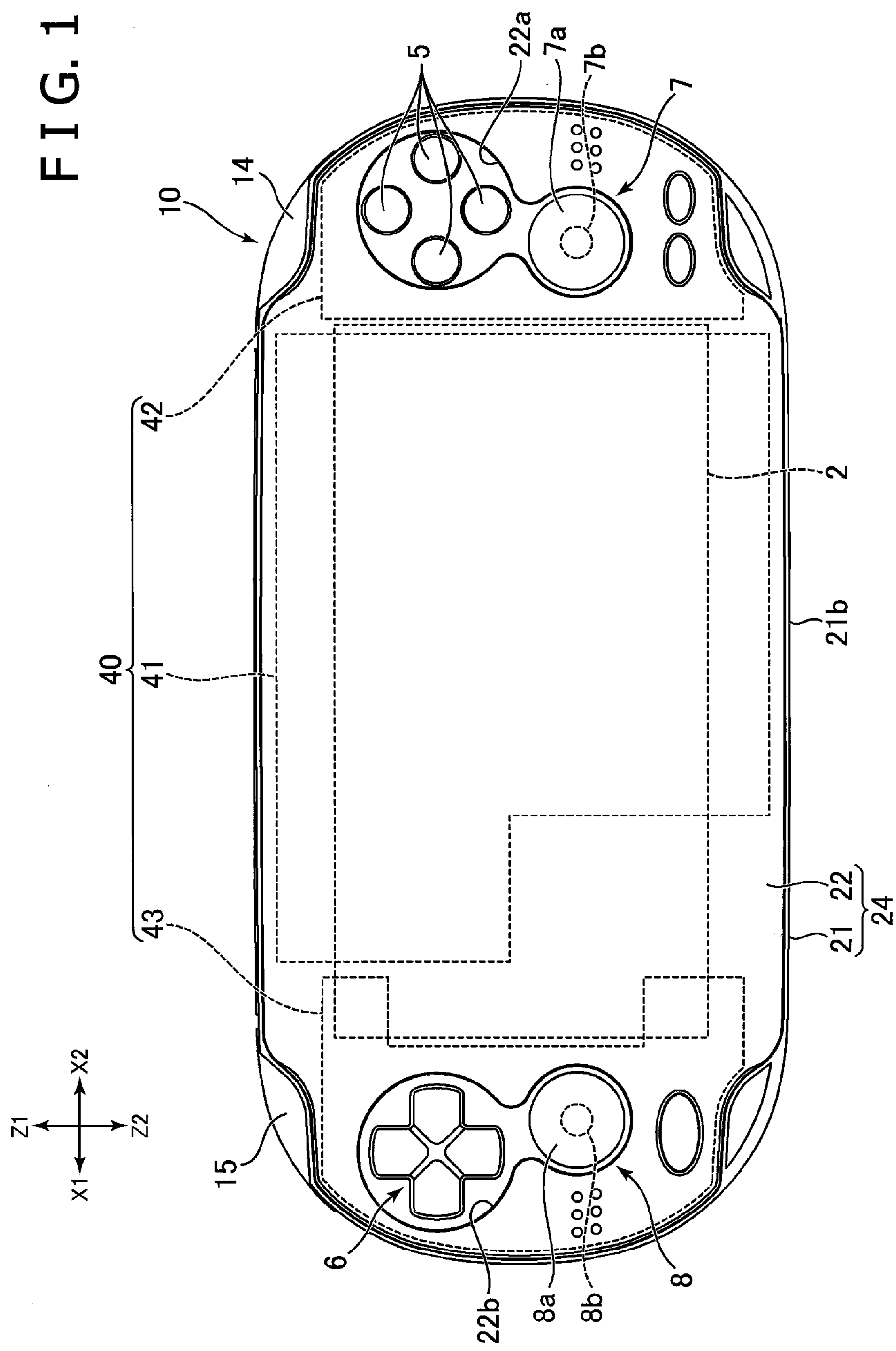
FIG. 1 is a front view of a portable type electronic device according to an embodiment of the present invention.
Figure 2:
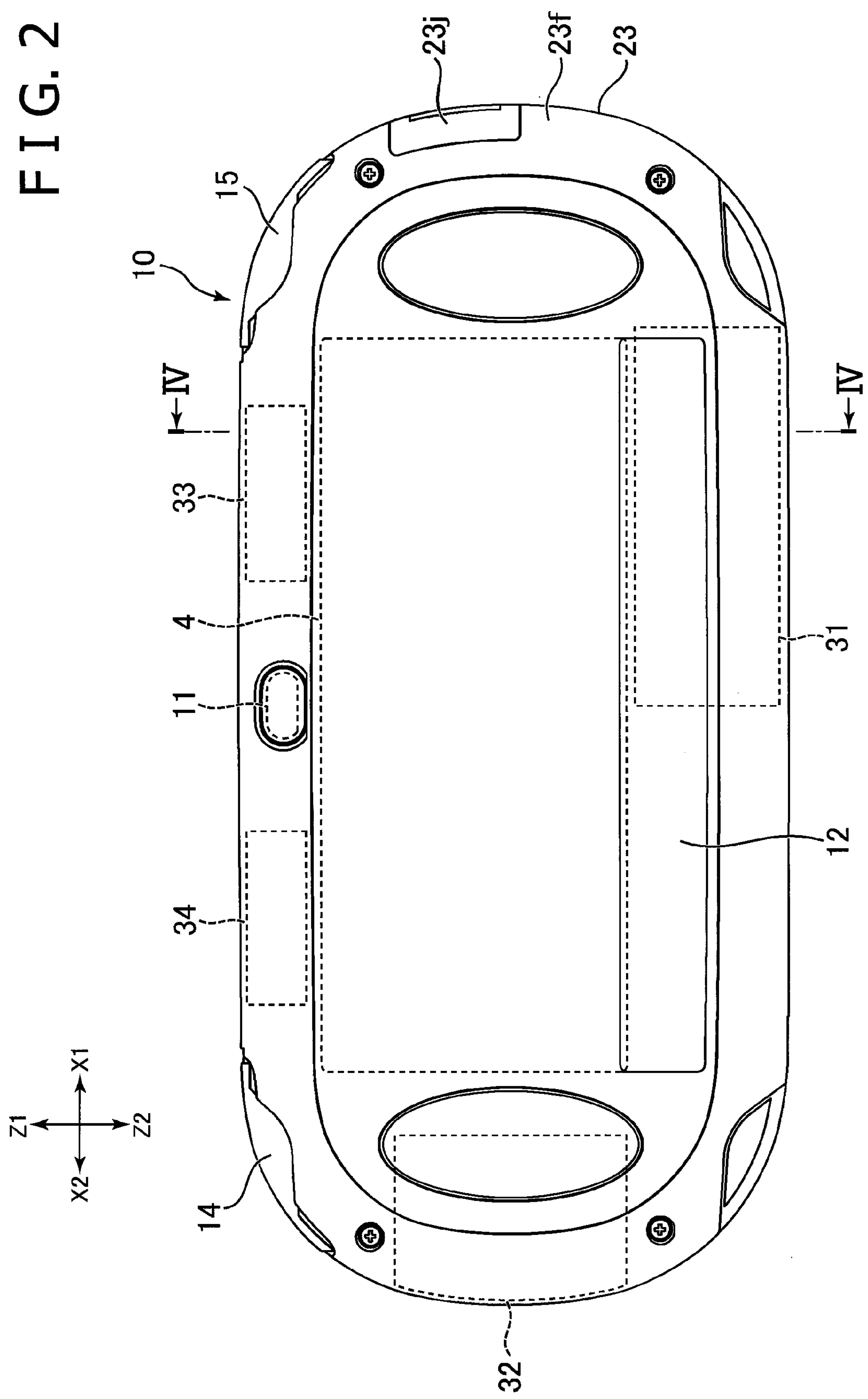
FIG. 2 is a rear view of the electronic device.
Figure 3:
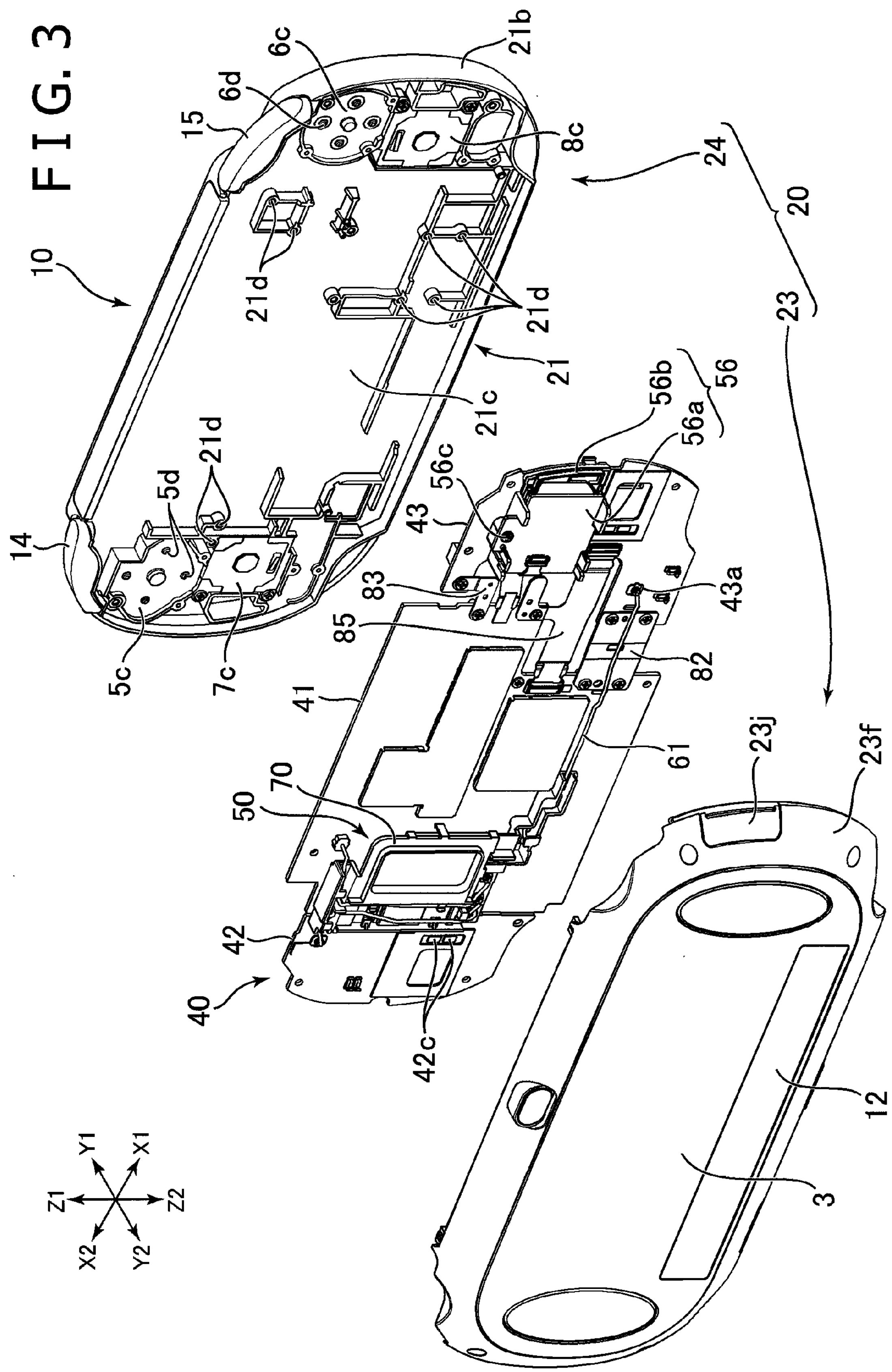
FIG. 3 is an exploded perspective view of the electronic device.
Figure 4:
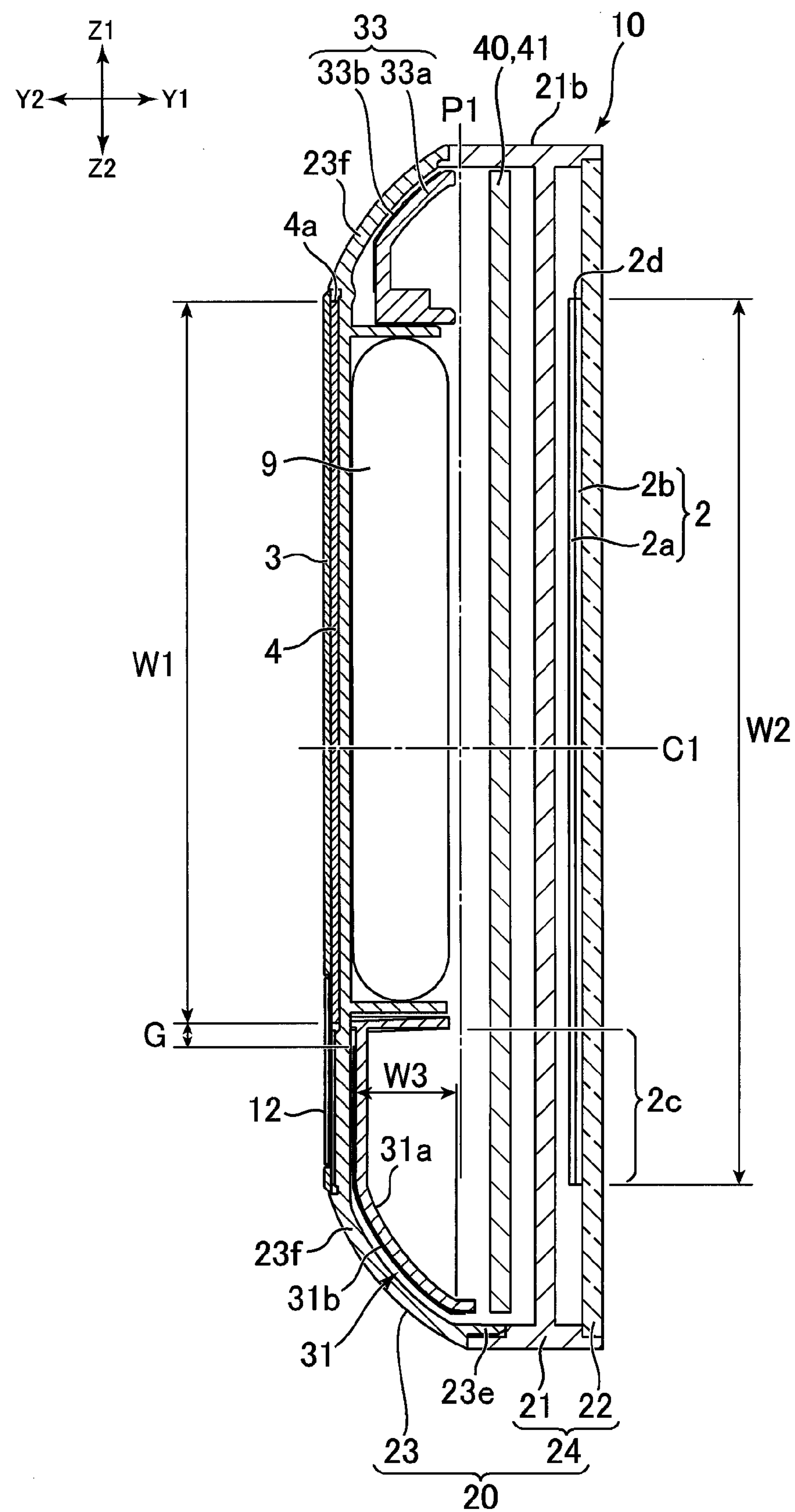
FIG. 4 is a sectional view of a housing, the section being taken along a line IV-IV shown in FIG. 2.

An embodiment of the present invention will hereinafter be described with reference to the drawings. FIG. 1 is a front view of a portable type electronic device 10 according to an embodiment of the present invention. FIG. 2 is a rear view of the electronic device 10. FIG. 3 is an exploded perspective view of the electronic device 10. FIG. 4 is a sectional view of a housing, the section being taken along a line IV-IV shown in FIG. 2.

Incidentally, the following description, directions denoted by X1 and X2 in FIG. 1 are a left direction and a right direction, respectively, and directions denoted by Z1 and Z2 in FIG. 1 are an upward direction and a downward direction, respectively. In addition, directions denoted by Y1 and Y2 in FIG. 4 are a front direction and a rear direction, respectively.

[General Constitution]

The electronic device 10 has a housing 20 that houses a circuit board 40 and the like and which forms an external surface of the electronic device 10. As shown in FIG. 3, the housing 20 in the present example is formed by a front housing 24 covering the front side of the circuit board 40 and a back housing 23 that covers the back side of the circuit board 40 and which is combined with the front housing 24 in a front-rear direction. As shown in FIG. 4, the front housing 24 is formed by a front housing main body 21 and a front panel 22 that is disposed on the front side of the front housing main body 21 and which forms a front surface of the electronic device 10. The front panel 22 is attached to the front housing main body 21. The front housing main body 21 has a peripheral wall portion 21*b* forming side surfaces, an upper surface, and a lower surface of the electronic device 10. An outer peripheral portion of the front panel 22 is attached to an edge of the peripheral wall portion 21*b*. The front panel 22 is formed of an optically transparent material (for example glass or resin such as an acrylic or the like). The front housing main body 21 and the back housing 23 are also molded of a resin.

As shown in FIG. 1 and FIG. 4, the electronic device 10 has a display panel unit 2 including a display panel 2*a* on the front surface side of the housing 20, that is, on the front panel 22. Various display panels such for example as a liquid crystal display panel, an organic EL panel, or a field emission display panel can be used as the display panel 2*a*.

In addition, the display panel unit 2 in the present example has a touch panel 2*b*. The touch panel 2*b* is a position detecting device for detecting the position of a finger of a user when the user touches the front surface (surface of the front panel 22 in the present example) of the electronic device 10 with the finger. The touch panel 2*b* in the present example is a capacitive type panel. The touch panel 2*b* is not limited to this. Panels of other types such as a resistive film type, an electromagnetic induction type, and the like may be used as the touch panel 2*b*.

The touch panel 2*b* is disposed between the display panel 2*a* and the front panel 22. The display panel unit 2 is disposed on the inside of the front panel 22 in such an attitude as to face the front panel 22. In the present example, as shown in FIG. 4, the touch panel 2*b* is laminated to the front panel 22, and the display panel 2*a* is laminated to the touch panel 2*b*, so that these three panels are integral with each other.

The touch panel 2*b* and the display panel 2*a* have sizes corresponding to each other. That is, the touch panel 2*b* and the display panel 2*a* have widths approximately equal to each other in an upward-downward direction and a left-right direction. Incidentally, the touch panel 2*b* does not necessarily need to be provided to the electronic device 10.

The electronic device 10 in the present example is a device that functions as a game device and a moving image and audio reproducing device. As shown in FIG. 1, the electronic device 10 has a plurality of operating members operated by the user during game play or the like on the left and right of the display panel unit 2. In the present example, a plurality of operating buttons (four operating buttons in the present example) 5 are disposed on the right side of the display panel unit 2. The four buttons 5 are located at respective end portions of a cross. In addition, a cross key 6 is disposed on the left side of the display panel unit 2. Further, operating sticks 7 and 8 are disposed respectively on the right side and the left side of the display panel unit 2. The operating sticks 7 and 8 include shaft portions 7*b* and 8*b* projecting forward from the front surface of the electronic device 10 and disk-shaped operating portions 7*a* and 8*a* formed on head portions of the shaft portions 7*b* and 8*b*. The operating sticks 7 and 8 can be inclined in a radial direction of the shaft portions 7*b* and 8*b* such as the upward-downward direction, the left-right direction, or the like, and rotated in a circumferential direction in a state of the shaft portions 7*b* and 8*b* being inclined. In addition, the operating sticks 7 and 8 may be slidable in the radial direction of the shaft portions 7*b* and 8*b*. Further, the electronic device 10 has top buttons 14 and 15 respectively in a rightmost portion and a leftmost portion of the top surface of the electronic device 10. The top buttons 14 and 15 can be pressed downward, that is, in the direction denoted by Z2 in FIG. 1.

The plurality of operating members 5, 6, 7, and 8 are disposed so as to project forward from openings 22*a* and 22*b* formed in the front panel 22. As shown in FIG. 3, the front housing main body 21 has a plate-shaped frame portion 21*c* that is located on the inside of the peripheral wall portion 21*b* and which covers the front side of the circuit board 40. The frame portion 21*c* retains a base 5*a* that is disposed on the back surface side of the plurality of operating buttons 5 and which supports the operating buttons 5 in such a manner as to be movable forward and rearward and a base 6 that is disposed on the back surface side of the cross key 6 and which supports the end portions of the cross key 6 in such a manner as to be movable forward and rearward. Further, the frame portion 21*c* retains cases 7*c* and 8*c* of supporting mechanisms that are located at base portions of the operating sticks 7 and 8 and which support the base portions of the operating sticks 7 and 8.

As shown in FIG. 2 and FIG. 4, the electronic device 10 has a rear touch panel 4 on the rear side of the housing 20, that is, on the back housing 23. The rear touch panel 4 in the present example is a capacitive type panel. The rear touch panel 4 is not limited to this. Panels of a resistive film type, an electromagnetic induction type, and the like may be used as the rear touch panel 4. The user can place a finger (for example a middle finger) on the rear touch panel 4 and place a finger (for example an index finger) on the top buttons 14 and 15 while holding the right side part (that is, a part provided with the operating buttons 5 and the operating stick 7) and the left side part (that is, a part provided with the cross key 6 and the operating stick 8) of the electronic device 10. The surface of the rear touch panel 4 is covered with a protective panel 3 for protecting the rear touch panel 4. The protective panel 3 is a panel of glass, resin (for example an acrylic), or the like.

As shown in FIG. 4, the size of the rear touch panel 4 is smaller than the size of the display panel unit 2. A width W1 in the upward-downward direction of the rear touch panel 4 in the present example is smaller than a width W2 in the upward-downward direction of the display panel unit 2, that is, a width in the upward-downward direction of the display panel 2*a* and the touch panel 2*b*. In addition, the rear touch panel 4 is offset in one of the upward direction and the downward direction (upward direction in the present example) with respect to the display panel unit 2. That is, a center line in the upward-downward direction of the rear touch panel 4 is located above a center line C1 in the upward-downward direction of the display panel unit 2. Such a layout of the rear touch panel 4 facilitates the sliding of a finger of the user which finger is disposed on the top surface of the electronic device 1 to the rear touch panel 4, and is thus able to improve the operability of the rear touch panel 4. Incidentally, in the present example, the positions of an upper edge 2*d* of the display panel unit 2 and an upper edge 4*a* of the rear touch panel 4 substantially coincide with each other in the upward-downward direction. The rear touch panel 4 has a width in the left-right direction substantially coinciding with that of the display panel unit 2. In addition, the display panel unit 2 and the rear touch panel 4 are located in the center in the left-right direction of the electronic device 10. A plate 12 formed of a nonconductive material such as resin or the like is disposed on a side lower than the touch panel 4.

[Antenna Layout]

Figure 5:
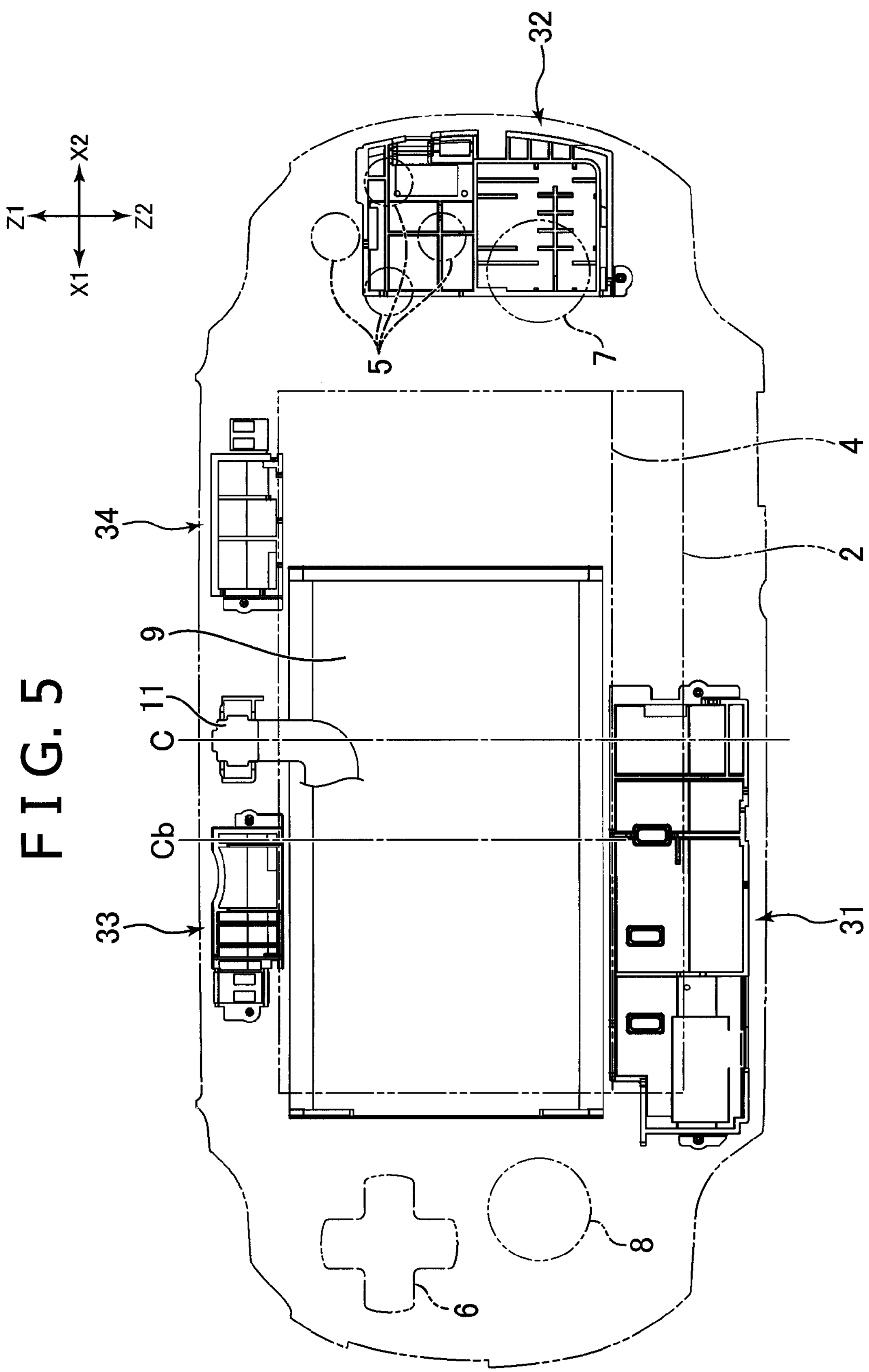
FIG. 5 is a diagram showing the layout of antennas provided to the electronic device.

The electronic device 10 has a wireless communication function. As shown in FIG. 2, antennas 31, 32, and 33 are disposed within the housing 20. In addition, the electronic device 10 in the present example has a position detecting function using a GPS (Global Positioning System), and includes an antenna 34 as a GPS antenna. FIG. 5 is a diagram showing the layout of the antennas 31 to 34 provided to the electronic device 10. FIG. 5 shows the layout of the antennas 31 to 34 when the electronic device 10 is viewed from the front. FIG. 6 is an exploded perspective view of the antennas 31 to 34 and the back housing 23.

In the following description, the antennas indicated by reference numerals 31, 32, 33, and 34 will be referred to as a first antenna, a second antenna, a third antenna, and a fourth antenna, respectively. The first antenna 31 and the second antenna 32 are an antenna for performing communication using a mobile telephone network (for example a system referred to as a third-generation mobile communication system). The third antenna 33 is an antenna for performing communication using a wireless LAN.

As shown in FIG. 4, the first antenna 31 is disposed closer to the rear touch panel 4 than to the display panel 2*a* in the front-rear direction of the housing of the electronic device 10. That is, the first antenna 31 is located on the side of the rear touch panel 4 with respect to a vertical plane P1 passing through a center between the display panel 2*a* and the rear touch panel 4. As described above, the electronic device 10 in the present example has the touch panel 2*b*. The first antenna 31 is disposed closer to the rear touch panel 4 than to the display panel 2a and the touch panel 2b, so that a sufficient distance can be secured between the first antenna 31 and the display panel unit 2. In the present example, the circuit board 40 is disposed between the display panel unit 2 and the rear touch panel 4. The first antenna 31 is located on the opposite side from the display panel unit 2 with the circuit board 40 interposed in between.

As shown in FIG. 4, the display panel 2a and the touch panel 2b in the present example are bonded to the inner surface of the front panel 22, and no clearance is formed between the panels 2a and 2b and the front panel 22. Therefore, a distance from the first antenna 31 to the display panel unit 2 can be increased as compared to a structure in which a clearance is provided between the panels 2a and 2b and the front panel 22.

As shown in FIG. 2 and FIG. 5, the first antenna 31 is disposed so as to be offset with respect to the rear touch panel 4 in a direction perpendicular to the front-rear direction so that at least a part of the first antenna 31 does not overlap the rear touch panel 4 in the front-rear direction. That is, at least a part of the first antenna 31 is located outwardly of the outer edge of the rear touch panel 4. According to such a layout of the first antenna 31, distances from both of the rear touch panel 4 and the display panel unit 2 to the first antenna 31 can be maintained, and good reception sensitivity of the first antenna 31 can be obtained.

As described above, the rear touch panel 4 has a smaller size than the display panel unit 2. In the present example, as shown in FIG. 4, the width W1 in the upward-downward direction of the rear touch panel 4 is smaller than the width W2 in the upward-downward direction of the display panel unit 2. Therefore, the display panel unit 2 has a portion 2c that does not overlap the rear touch panel 4 in the front-rear direction. Thus, the first antenna 31 can be disposed in the rear of the non-overlapping portion 2c. As a result, it is possible to facilitate the layout of the first antenna 31 while securing a sufficient size of the display panel 2a.

In the present example, as described above, the rear touch panel 4 is offset upward with respect to the center C1 in the upward-downward direction of the display panel unit 2. Meanwhile, as shown in FIG. 4, the first antenna 31 is located so as to be offset downward from the rear touch panel 4. That is, the first antenna 31 is located so as to be offset with respect to the rear touch panel 4 in the opposite direction from the direction in which the rear touch panel 4 is offset with respect to the display panel unit 2. According to such a layout of the rear touch panel 4 and the first antenna 31, it is possible to increase the width in the upward-downward direction of the first antenna 31 while suppressing an increase in the width in the upward-downward direction of the electronic device 1. In the present example, the first antenna 31 is disposed along a lower edge 23e of the back housing 23. In addition, the first antenna 31 has a film-shaped antenna main body 31b to be described later in the surface of the first antenna 31. The whole of the antenna main body 31b is located below the rear touch panel 4. Incidentally, the position of an upper edge of the first antenna 31 substantially coincides, in the upward-downward direction, with the position of a lower edge of the rear touch panel 4.

As described above, the top buttons 14 and 15 are provided in the rightmost portion and the leftmost portion of the top surface of the electronic device 10. There is a case where the user slides fingers placed on the top buttons 14 and 15 downward to the rear touch panel 4 with an intention of operating the rear touch panel 4. The first antenna 31 is disposed below the rear touch panel 4. Therefore, even when the user slides the fingers in such a manner, the first antenna 31 is not covered by the fingers of the user.

As described above, the electronic device 10 includes the operating buttons 5 and the operating stick 7 disposed on the right side of the display panel unit 2 and the cross key 6 and the operating stick 8 disposed on the left side of the display panel unit 2 (see FIG. 1). As shown in FIG. 5, the position of the first antenna 31 in the left-right direction is between the cross key 6 and the operating stick 8 on the left side and the operating buttons 5 and the operating stick 7 on the right side. That is, the first antenna 31 is located more to the right than the cross key 6 and the operating stick 8 on the left side, and is located more to the left than the operating buttons 5 and the operating stick 7 on the right side. According to such a layout, the first antenna 31 can be prevented from being covered by the hands of the user when the user is operating the operating members 5, 6, 7, and 8 while holding the right side part and the left side part of the electronic device 10.

As shown in FIG. 4, the rear touch panel 4 is attached to the back housing 23. The rear touch panel 4 in the present example is attached to the outer surface (rear surface) of the back housing 23. Meanwhile, the first antenna 31 is disposed on the inside of the back housing 23. Therefore, a small distance in the front-rear direction is provided between the rear touch panel 4 and the first antenna 31. The reception sensitivity of the first antenna 31 can be improved also by this structure. Incidentally, in the present example, as described above, the plate 12 is disposed below the rear touch panel 4. This plate 12 is also laminated to the outer surface of the back housing 23. The first antenna 31 and the plate 12 are located on the opposite sides from each other with the back housing 23 interposed in between.

As shown in FIG. 6, a first housing space 23a surrounded by a plurality of wall portions is formed on the inside of the back housing 23. The first housing space 23a corresponds to the external shape of the first antenna 31. The first antenna 31 is disposed in the first housing space 23a. Incidentally, in FIG. 6, the first housing space 23a is hatched to make the first housing space 23a clear.

Figure 7:
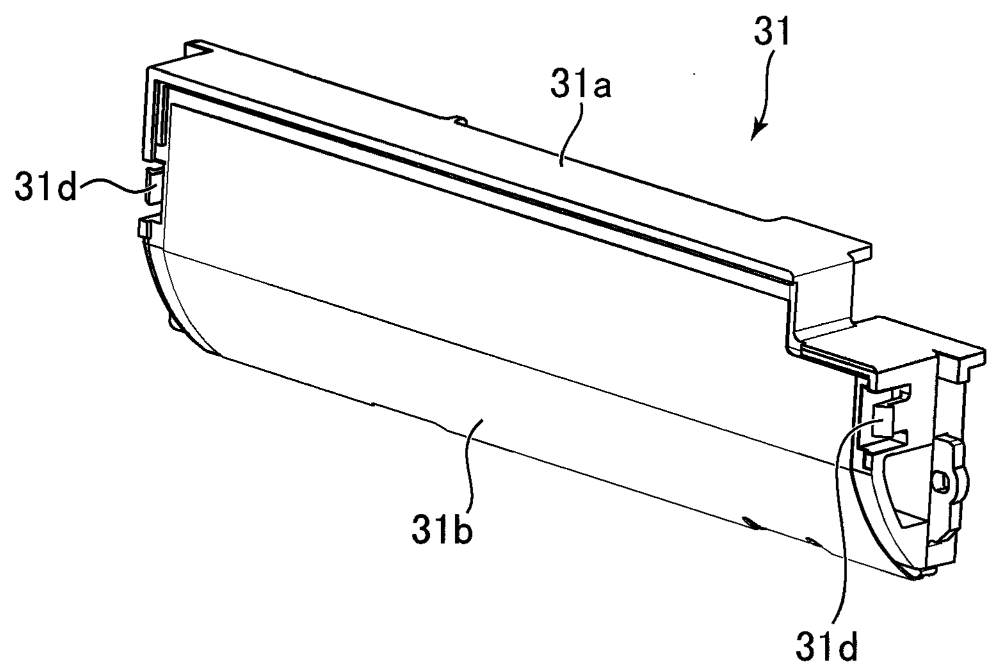
FIG. 7 is a perspective view of the first antenna shown in FIG. 5.

FIG. 7 is a perspective view of the first antenna 31. As shown in FIG. 4, FIG. 6, and FIG. 7, the first antenna 31 has a base 31a formed by resin. The base 31a has a box shape opened to the front. In addition, the first antenna 31 has the film-shaped antenna main body 31b. The antenna main body 31b is laminated to the outer surface (rear surface) of the base 31a, and faces the rear. As shown in FIG. 6, ribs 31c for securing the strength of the base 31a are formed on the inside of the base 31a. In addition, as shown in FIG. 7, pawl-shaped engaging portions 31d are formed on the left and right of the base 31a. The engaging portions 31d catch on the wall portions defining the first housing space 23a. The first antenna 31 is thereby fixed to the back housing 23.

As shown in FIG. 3 and FIG. 4, in the present example, the back housing 23 has an outer peripheral portion 23f curved toward the front panel 22. The outer peripheral portion 23f is formed on the entire perimeter of the back housing 23. A lower portion of the base 31a and the antenna main body 31b are curved along the outer peripheral portion 23f. Such a shape of the first antenna 31 can bring the antenna main body 31b closer to the inner surface of the outer peripheral portion 23f. As a result, a sufficient distance between the display panel unit 2 and the first antenna 31 is secured easily. Incidentally, because the antenna main body 31b has such a curved shape, the antenna main body 31b has a width W3 in the front-rear direction. The first antenna 31 can obtain even better reception sensitivity due to such a shape of the antenna main body 31*b*. In addition, a clearance G in the upward-downward direction is provided between an upper edge of the antenna main body 31*b* and the lower edge of the rear touch panel 4.

The electronic device 10 has two antennas for a same communicating function. Specifically, as shown in FIG. 5, the electronic device 10 includes the second antenna 32 in addition to the first antenna 31. Both of the first antenna 31 and the second antenna 32 function as an antenna for communications using the mobile telephone network.

As shown in FIG. 5, the second antenna 32 is located so as to be offset from the rear touch panel 4 and the display panel unit 2 in one of the right direction or the left direction (right direction in the present example). In the present example, the whole of the second antenna 32 is located more to the right than the rear touch panel 4 and the display panel unit 2. On the other hand, as described above, the first antenna 31 is located below the rear touch panel 4. According to such a layout of the first antenna 31 and the second antenna 32, when the user views a moving image on the display panel 2*a* while holding the lower portion of the electronic device 10 with a hand, the first antenna 31 is covered by the hand, but the second antenna 32 is not covered by the hand. Incidentally, as described above, the operating buttons 5 and 6 and the operating sticks 7 and 8 are provided on the right side and the left side of the display panel unit 2. The second antenna 32 is located in the rear of the operating buttons 5 and the operating stick 7 on the right side.

As shown in FIG. 5, the electronic device 10 has a battery 9 housed in the housing 20. In the left-right direction, the battery 9 is offset with respect to the display panel unit 2 and the rear touch panel 4 in the left direction. A center Cb in the left-right direction of the battery 9 and the second antenna 32 are located on the opposite sides from each other with a center C in the left-right direction of the display panel unit 2 and the rear touch panel 4, that is, a center in the left-right direction of the electronic device 10 interposed in between. The battery 9 is a particularly heavy part among the parts included in the electronic device 10. Therefore, when the user holds the electronic device 10 with one hand, the user often holds the left side part of the electronic device 10 in which the battery 9 is disposed. At this time, the second antenna 32 is not covered by the hand, so that good reception sensitivity is obtained easily. Incidentally, as shown in FIG. 5, no antenna is disposed on the opposite side from the second antenna 32 with the rear touch panel 4 and the display panel unit 2 interposed in between. That is, no antenna is disposed in the rear of the operating button 6 and the operating stick 8 on the left side.

As shown in FIG. 5, as with the battery 9, the above-described first antenna 31 is offset in the left direction with respect to the center C of the left-right direction of the display panel unit 2 and the rear touch panel 4. Therefore, a sufficient distance is easily secured between the first antenna 31 and the second antenna 32, and thus good reception sensitivity is obtained easily.

As described above, the electronic device 10 includes the third antenna 33 and the fourth antenna 34. As shown in FIG. 4 and FIG. 5, the third antenna 33 and the fourth antenna 34 are disposed on the opposite side from the first antenna 31 with the rear touch panel 4 interposed in between. According to this layout, a sufficient distance is secured from the first antenna 31 to the third antenna 33 and the fourth antenna 34. As a result, good reception sensitivity of these antennas is obtained easily. In the present example, the battery 9 is disposed between the first antenna 31 and the third antenna 33 and the fourth antenna 34.

As shown in FIG. 5, the third antenna 33 and the fourth antenna 34 are disposed on the opposite sides from each other with the center C in the left-right direction of the display panel unit 2 interposed in between, and a camera unit 11 is disposed between the third antenna 33 and the fourth antenna 34. According to such a layout, a space between the third antenna 33 and the fourth antenna 34 can be used effectively while a sufficient distance is secured between the third antenna 33 and the fourth antenna 34.

As described above, the first antenna 31 is retained by the back housing 23. In addition, as shown in FIG. 6, the other antennas 32 to 34 are also retained by the back housing 23. These antennas 31 to 34 are located outwardly of an outer peripheral edge of the rear touch panel 4. In other words, the antennas 31 to 34 are retained by the back housing 23 so as to surround the rear touch panel 4. In particular, in the present example, the antennas 31 to 34 are arranged along outer edges of the back housing 23. Specifically, as described above, the first antenna 31 is disposed along the lower edge 23*e* of the back housing 23. The second antenna 32 is disposed along a right edge 23*g* of the back housing 23. Further, the third antenna 33 and the fourth antenna 34 are located above the rear touch panel 4, and are disposed along an upper edge 23*k* of the back housing 23.

As shown in FIG. 6, a second housing space 23*b* defined by a plurality of wall portions is formed on the inside of the back housing 23. The second housing space 23*b* corresponds to the shape of the second antenna 32. The second antenna 32 is fitted in the second housing space 23*b*. Similarly, a third housing space 23*c* defined by a plurality of walls and a fourth housing space 23*d* defined by a plurality of walls are formed on the inside of the back housing 23. The third housing space 23*c* and the fourth housing space 23*d* correspond respectively to the external shape of the third antenna 33 and the external shape of the fourth antenna 34. The third antenna 33 and the fourth antenna 34 are fitted in the third housing space 23*c* and the fourth housing space 23*d*, respectively. Incidentally, in FIG. 6, the housing spaces 23*b*, 23*c*, and 23*d* are hatched to make these housing spaces 23*b*, 23*c*, and 23*d* clear.

Figure 8:
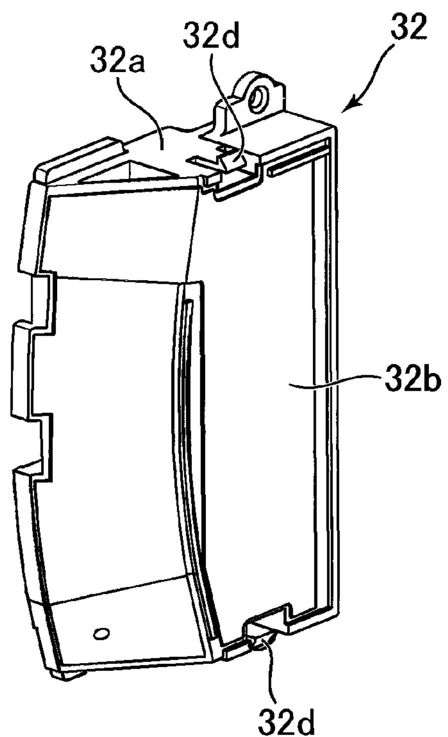
FIG. 8 is a perspective view of the second antenna, the third antenna, and the fourth antenna shown in FIG. 5.
Figure 8:
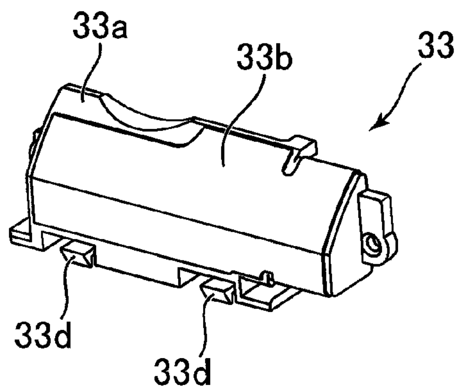
Figure 8:
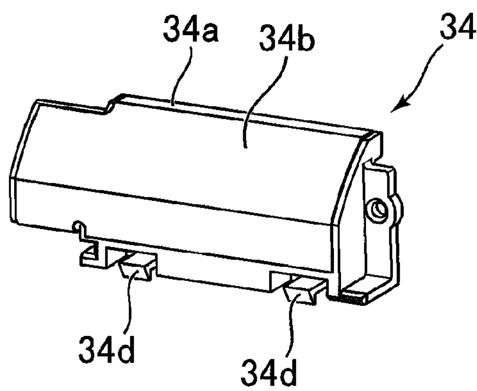

FIG. 8 is a perspective view of the antennas 32, 33, and 34. FIG. 8(*a*) shows the second antenna 32. FIG. 8(*b*) shows the third antenna 33. FIG. 8(*c*) shows the fourth antenna 34. As shown in FIG. 6 and FIG. 8, the antennas 32, 33, and 34 respectively have bases 32*a*, 33*a*, and 34*a* formed by resin. These bases 32*a*, 33*a*, and 34*a* have substantially a box shape opened to the front. A plurality of ribs are formed on the inside of the bases 32*a*, 33*a*, and 34*a*. Pawl-shaped engaging portions 32*d*, 33*d*, and 34*d* are formed on edges of the bases 32*a*, 33*a*, and 34*a* (see FIG. 8). The engaging portions 32*d*, 33*d*, and 34*d* catch on the wall portions defining the housing spaces 23*b*, 23*c*, and 23*d*. The antennas 32, 33, and 34 are thereby fixed to the back housing 23.

As shown in FIG. 8, the antennas 32, 33, and 34 respectively have film-shaped antenna main bodies 32*b*, 33*b*, and 34*b*. The antenna main bodies 32*b*, 33*b*, and 34*b* are laminated to the outer surfaces (rear surfaces) of the bases 32*a*, 33*a*, and 34*a*, and face the rear. As described above, the back housing 23 in the present example has the curved outer peripheral portion 23*f*. The base 32*a* and the antenna main body 32*b* of the second antenna 32 are curved along the outer peripheral portion 23*f*. According to such a shape of the antenna main body 32*b*, as with the antenna main body 31*b*, the antenna main body 32*b* can have a width in the front-rear direction, and thus obtain good reception sensitivity. In addition, the base 33*a* and the antenna main body 33*b* of the third antenna 33 and the base 34_a_ and the antenna main body 34_b_ of the fourth antenna 34 are also curved along the outer peripheral portion 23_f_.

[Cable Retaining Structure]

Figure 9:
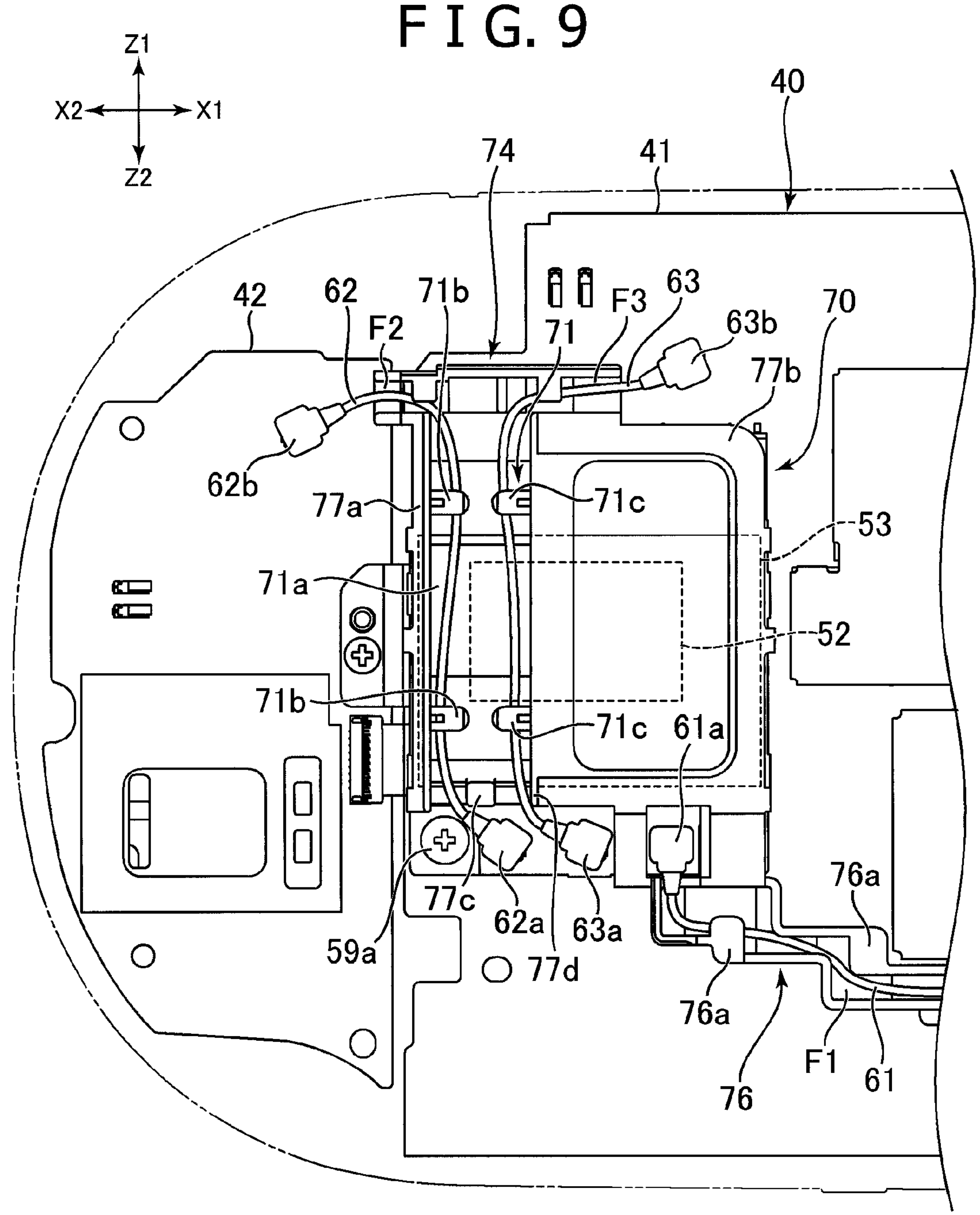
FIG. 9 is a rear view of a circuit board provided to the electronic device.
Figure 10:
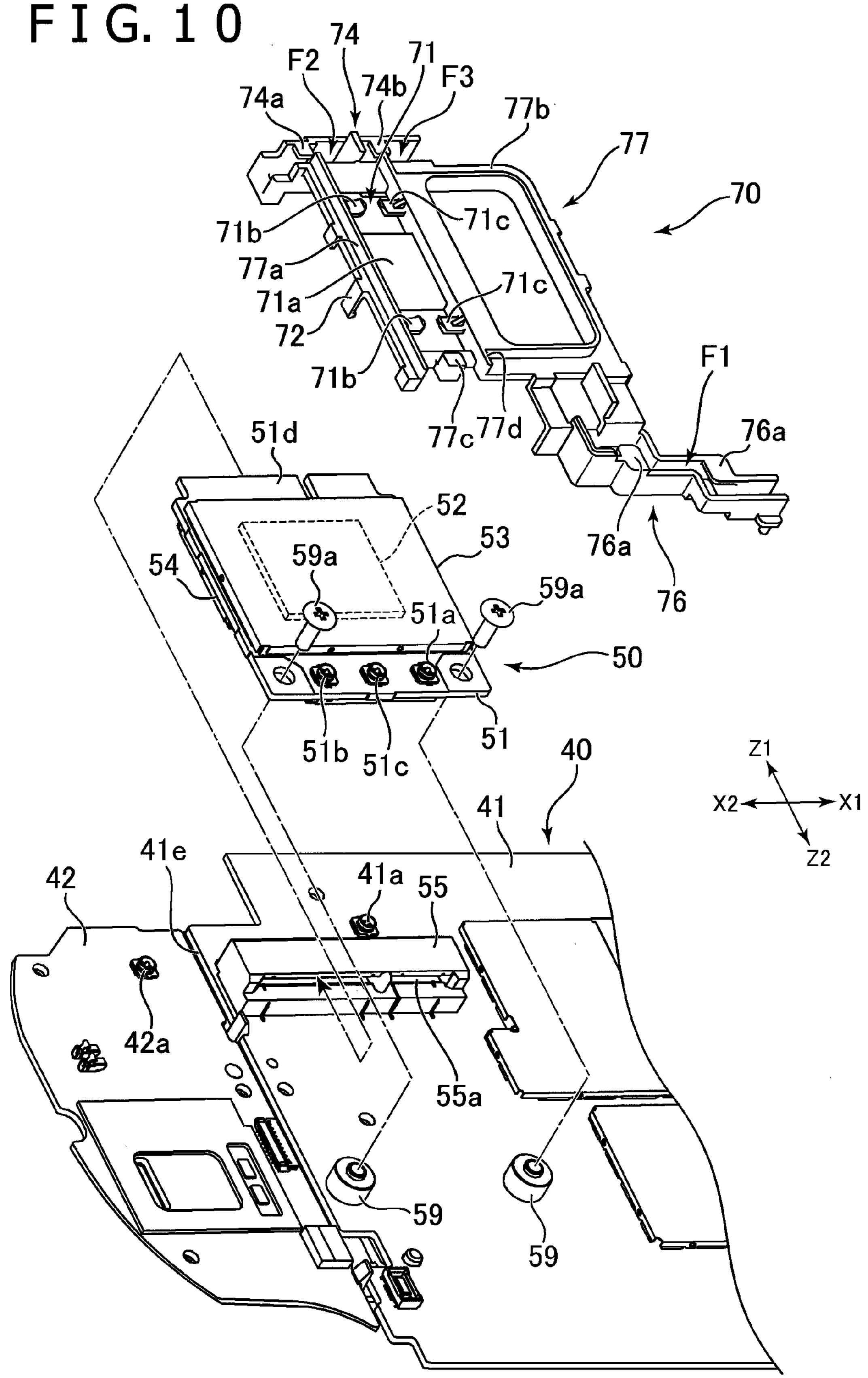
FIG. 10 is an exploded perspective view of a communication module and a cable holder provided to the circuit board shown in FIG. 9.
Figure 11:
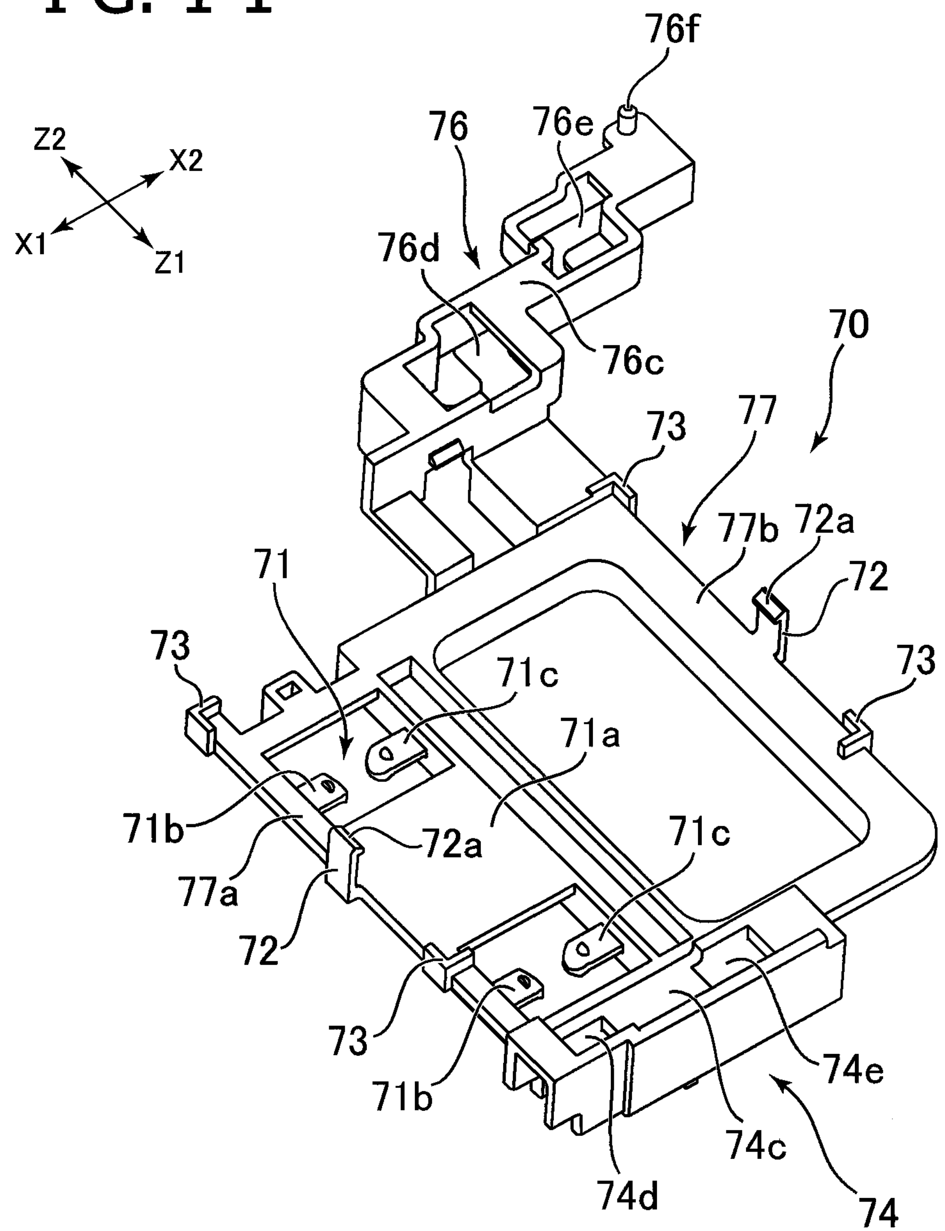
FIG. 11 is a perspective view of the cable holder.

As shown in FIG. 1, the circuit board 40 is housed in the housing 20 of the electronic device 10. The circuit board 40 in the present example is formed by a main board 41, a right sub-board 42 disposed on the right side of the main board 41, and a left sub-board 43 disposed on the left side of the main board 41. As shown in FIG. 3, the electronic device 10 includes a communication module 50 disposed on the main board 41. FIG. 9 is a rear view of the communication module 50 disposed on the main board 41, that is, a diagram facing the communication module 50 from the back housing 23. FIG. 10 is an exploded perspective view of the main board 41, the communication module 50, and a cable holder 70 to be described later. FIG. 11 is a perspective view of the cable holder 70. FIG. 11 shows a bottom surface of the cable holder 70.

As described above, the electronic device 10 includes the first antenna 31, the second antenna 32, and the third antenna 33. The communication module 50 is a module in charge of processing for communications, such for example as demodulation processing/modulation processing on signals received/to be transmitted by the antennas 31 to 33.

The communication module 50 in the present example is disposed on the back surface side of the main board 41. As shown in FIG. 10, the communication module 50 has a circuit board (hereinafter referred to as a module board) 51 smaller than the main board 41. The module board 51 is disposed in such an attitude as to face the main board 41.

The main board 41 is mounted with a card edge type connector 55 into which to insert an edge (an upper edge 51_d_ in the present example) of the module board 51. The module board 51 is connected to the main board 41 through the connector 55. A signal processed by the communication module 50 is output to a microprocessor mounted on the main board 41 through the connector 55. In addition, a signal input from the microprocessor to the communication module 50 through the connector 55 is subjected to processing such as the above-described modulation and the like by the communication module 50, and thereafter output to the antennas 31, 32, and 33 through cables 61, 62, and 63 to be described later.

As shown in FIG. 10, a plurality of electronic parts such as an IC chip 52 and the like are mounted on one surface of the module board 51 (which surface is on the opposite side from the main board 41, and will hereinafter be referred to as a rear surface). The IC chip 52 is covered with a shield plate 53 made of a metal. In addition, in the present example, the module board 51 is supported in a state of being separated from the surface of the main board 41, and an IC chip is also mounted on a surface of the module board 51 which surface is on the side of the main board 41 (which surface will hereinafter be referred to as a front surface). The IC chip on the side of the main board 41 is covered by a shield plate 54 made of a metal. Incidentally, a plurality of IC chips 52 may be disposed on the rear surface of the module board 51. Similarly, a plurality of IC chips may be disposed on the front surface of the module board 51.

As shown in FIG. 10, the connector 55 has an insertion slot 55_a_ for receiving the upper edge of the module board 51. The insertion slot 55_a_ is located so as to be separated from the surface of the main board 41. In addition, a left and a right base 59 projecting in a direction of thickness of the main board 41 are formed on the main board 41. A lower edge of the module board 51 is attached to the bases 59 by screws 59_a_. The communication module 50 is supported in a state of being separated from the main board 41 by such an attachment structure.

As shown in FIG. 9, the electronic device 10 has a plurality of cables (three cables in this FIGS. 61, 62, and 63 whose end portions are attached to the module board 51. In the present example, connectors 51_a_, 51_b_, and 51_c_ are mounted on the module board 51 (see FIG. 10). Terminals 61_a_, 62_a_, and 63_a_ provided to the end portions of the cables 61, 62, and 63 are connected to the connectors 51_a_, 51_b_, and 51_c_. The cables 61, 62, and 63 in the present example are a coaxial cable, and the connectors 51_a_, 51_b_, and 51_c_ are a coaxial connector. In the present example, the connectors 51_a_, 51_b_, and 51_c_ are arranged along the lower edge of the module board 51.

The cables 61, 62, and 63 are connected respectively to the above-described antennas 31, 32, and 33. In the present example, a terminal provided to another end portion of the cable 61 is attached to a coaxial connector 43_a_ (see FIG. 3) mounted on the left sub-board 43, and the cable 61 is connected to the first antenna 31 through the left sub-board 43. In addition, as shown in FIG. 9 and FIG. 10, a terminal 62_b_ formed at another end portion of the cable 62 is attached to a coaxial connector 42_a_ mounted on the right sub-board 42. The cable 62 is connected to the second antenna 32 through a circuit pattern formed on the right sub-board 42. Similarly, a terminal 63_b_ formed at another end portion of the cable 63 is attached to a coaxial connector 41_a_ mounted on the main board 41. The cable 63 is connected to the third antenna 33 through a circuit pattern formed on the main board 41.

As shown in FIG. 9 and FIG. 10, the cables 62 and 63 straddle the electronic parts mounted on the module board 51 such as the IC chip 52 and the like. That is, the cables 62 and 63 extend to the opposite side from the connectors 51_b_ and 51_c_ with the IC chip 52 interposed in between. In the present example, the cables 62 and 63 extend upward from the connectors 51_b_ and 51_c_. In addition, the cables 62 and 63 are located on the opposite side from the module board 51 with respect to the IC chip 52. That is, the cables 62 and 63 are disposed on the face side of the IC chip 52. In the example shown in FIG. 9, in particular, the cable 63 is located directly above the IC chip 52. The electronic device 10 includes the cable holder 70 attached to the module board 51. The cable holder 70 retains the cables 62 and 63 such that the cables 62 and 63 are fastened in a state of straddling the IC chip 52. The cable holder 70 in the present example has a retaining portion 71 located on the opposite side of the IC chip 52 from the module board 51. The cables 62 and 63 are retained by the retaining portion 71. As described above, the back surface side of the circuit board 40 is covered by the back housing 23. According to this structure using the cable holder 70, the cables 62 and 62 can be disposed in a narrow space between the communication module 50 and the back housing 23, and a degree of freedom of layout of parts on the main board 41 and the right sub-board 42 which parts are disposed around the communication module 50 can be increased. In addition, because the positions of the cables 62 and 63 are defined by the retaining portion 71, the cables 62 and 63 can be prevented from interfering with the ribs formed in the back housing 23 and the like.

Incidentally, the shield plate 53 is located between the IC chip 52 and the retaining portion 71, and the cables 62 and 63 extend upward along the surface of the shield plate 53. The shield plate 53 thereby prevents the heat of the IC chip 52 from being transmitted to the cables 62 and 63.

As shown in FIG. 10, the cable holder 70 in the present example has a main body portion 77 including the retaining portion 71. The main body portion 77 has an external shape of a size corresponding to the size of the module board 51. The module board 51 has a rectangular shape, and the main body portion 77 also has a substantially rectangular shape. The main body portion 77 has a bar frame 77*a* extending in the upward-downward direction, that is, extending in a direction along the cables 62 and 63. In addition, the main body portion 77 has a rectangular frame 77*b* that is located on the opposite side from the bar frame 77*a* with the retaining portion 71 interposed in between, and which has an opening formed on the inside. Most of the shield plate 53 is exposed from the opening on the inside of the rectangular frame 77*b*. Such a structure of the main body portion 77 facilitates the emission of heat of the shield plate 53 to the outside through the inside of the rectangular frame 77*b*. Incidentally, the width in the left-right direction of the rectangular frame 77*b* is larger than a distance between the bar frame 77*a* and the rectangular frame 77*b*, that is, the width in the left-right direction of the retaining portion 71.

As shown in FIG. 10, the cable holder 70 is a member formed integrally by resin. In the present example, the cable holder 70 further includes guide portions 74 and 76 to be described later. The guide portions 74 and 76 and the main body portion 77 are formed integrally by a resin such as plastic or the like.

As shown in FIG. 10, the retaining portion 71 in the present example has arms 71*b* and 71*c*. The arms 71*b* and 71*c* project respectively from the bar frame 77*a* and one side of the rectangular frame 77*b* in a direction along the module board 51. As shown in FIG. 9, the cable 62 is passed between the arms 71*b* and the shield plate 53. In addition, the cable 63 is passed between the arms 71*c* and the shield plate 53. Thereby, the cables 62 and 63 are retained in positions close to the shield plate 53, and the cables 62 and 63 can be prevented from interfering with the back housing 23.

As shown in FIG. 10, the retaining portion 71 in the present example further includes a plate portion 71*a* stretched between the bar frame 77*a* and one side of the rectangular frame 77*b*. The plate portion 71*a* is located between the cables 62 and 63 and the shield plate 53. That is, the cables 62 and 63 are passed on the rear side of the plate portion 71*a*. The plate portion 71*a* regulates the movement of the cables 62 and 63 toward the shield plate 53, and thus prevents contact between the cables 62 and 63 and the shield plate 53.

In the present example, the retaining portion 71 has two arms 71*b* and 71*c* located so as to be separated from each other in the upward-downward direction, that is, located so as to be separated from each other in the extending direction of the cables 62 and 63. The plate portion 71*a* is located between the arms 71*b* and 71*c* on the upper side and the arms 71*b* and 71*c* on the lower side. The plate portion 71*a* in the present example has a plate shape elongated in the upward-downward direction (that is, the extending direction of the cables 62 and 62). According to such a shape of the plate portion 71*a*, long ranges of the cables 62 and 63 can be retained.

As described above, the arms 71*b* formed on the bar frame 77*a* and the arms 71*c* formed on the rectangular frame 77*b* extend in opposite directions from each other in the direction along the module board 51. End portions of the arms 71*b* and end portions of the arms 71*c* are free ends. Therefore, the cables 62 and 63 can be disposed between the arms 71*b* and 71*c* and the shield plate 53 by simple work.

As described above, the cables 62 and 63 are a coaxial cable. Therefore, the terminals 62*a* and 63*a* of the cables 62 and 63 may be rotated to the left and right about the connectors 51*b* and 51*c*. In the present example, as shown in FIG. 9, the retaining portion 71 is offset in the left direction with respect to the terminals 62*a* and 63*a* of the cables 62 and 63. Thus, the cables 62 and 63 extend in the left direction from the terminals 62*a* and 63*a*, and then extend upward. The terminals 62*a* and 63*a* therefore may be rotated in the right direction about the connectors 51*b* and 51*c*. As shown in FIG. 9 and FIG. 10, stoppers 77*c* and 77*d* are formed at end portions of the cable holder 70 which end portions are close to the connectors 51*b* and 51*c*. The cable 62 extends upward through a space between the stopper 77*c* and an end portion of the bar frame 77*a*, and the rotation of the cable 62 in the right direction is regulated by the stopper 77*c*. In addition, the cable 63 extends upward through a space between the stopper 77*c* and the stopper 77*d*, and the rotation of the cable 63 in the right direction is regulated by the stopper 77*d*.

Incidentally, thus regulating the rotation of the terminals 62*a* and 63*a* of the cables 62 and 63 can increase attachment stability of the terminals 62*a* and 63*a* and the connectors 51*b* and 51*c*. That is, in the present example, the retaining portion 71 is located on the shield plate 53, and is thus located at a higher position than the connectors 51*b* and 51*c*. When the terminals 62*a* and 63*a* rotate, parts of the cables 62 and 63 which parts are close to the terminals 62*a* and 63*a* go onto the retaining portion 71. According to the stoppers 77*c* and 77*d*, the cables 62 and 63 can be prevented from going onto the retaining portion 71.

As shown in FIG. 10 and FIG. 11, the cable holder 70 has a plurality of engaging portions (two engaging portions in the present example) 72 for fixing the cable holder 70 to the module board 51. The engaging portions 72 are formed so as to catch on edges of the module board 51. According to this structure, the work of attaching the cable holder 70 to the module board 51 can be facilitated.

The cable holder 70 in the present example has such a shape as to cover the module board 51 and the shield plate 53. That is, the external shape of the cable holder 70 is substantially a rectangle, and the width in the left-right direction of the cable holder 70 corresponds to the module board 51. The two engaging portions 72 are located on the opposite sides from each other with the module board 51 interposed in between, and each catch on outer edges (a right edge and a left edge in the present example) of the module board 51. Thereby, the cable holder 70 can be attached to the module board 51 stably, and the attachment work can be facilitated. Incidentally, the engaging portions 72 in the present example extend to the module board 51, and pawls 72*a* that catch on the edges of the module board 51 are formed at end portions of the engaging portions 72 (see FIG. 11).

In addition, in the present example, the position in the upward-downward direction and the left-right direction of the cable holder 70 is defined by the shield plate 53. Specifically, as shown in FIG. 11, a plurality of projections (four projections in the present example) 73 surrounding the outer periphery of the shield plate 53 as a whole are formed on the cable holder 70. The positions of the projections 73 correspond to four corner portions of the shield plate 53. Each of the projections 73 is bent so as to surround the outside of the corner portion of the shield plate 53. Then, the shield plate 53 is disposed on the inside of the four projections 73.

The cables 62 and 63 extend beyond an outer edge (upper edge in the present example) of the module board 51. As shown in FIG. 9 and FIG. 10, the cable holder 70 has the guide portion 74 located on the outside of the outer edge of the module board 51. The guide portion 74 defines the positions of the cables 62 and 63 in a region on the outside of the outer edge of the module board 51.

Specifically, the guide portion 74 forms side walls of a passage F2 in which the cable 62 is disposed and side walls of a passage F3 in which the cable 63 is disposed. In the present example, the cables 62 and 63 cross the connector 55 upward, the connector 55 being fitted with the upper edge of the module board 51. The guide portion 74 is formed in an upper part of the cable holder 70, and is located above the connector 55. In addition, the guide portion 74 is disposed on the circuit board 40 (more specifically the main board 41).

As shown in FIG. 9, the guide portion 74 forms the passage F2 extending in a direction of being bent with respect to a direction (upward-downward direction in the present example) in which the cable 62 straddles the IC chip 52. The cable 62 crosses the position of the connector 55, and is thereafter bent by the guide portion 74 and extends to the connector 42*a*. In addition, the guide portion 74 also forms the passage F3 extending in a direction of being bent with respect to a direction (upward-downward direction in the present example) in which the cable 63 straddles the IC chip 52. The passage F3 in the present example is a passage bent in the opposite direction from the passage F2. The cable 63 crosses the position of the connector 55, and is thereafter bent by the guide portion 74 and extends to the connector 41*a*. According to such a guide portion 74 that bends the cables 62 and 63, it is possible to reduce the width (width in the upward-downward direction in the present example) of the electronic device 10 while preventing interference between parts disposed above the connector 55 and the cables 62 and 63.

As shown in FIG. 10, the guide portion 74 has upper wall portions 74*a* and 74*b* that partially cover the passages F2 and F3. Thereby, the cables 62 and 63 can be prevented from slipping out of the passages F2 and F3. In addition, as shown in FIG. 11, the guide portion 74 has a bottom wall portion 74*c* forming bottoms of the passages F2 and F3. According to this structure, the cables 62 and 63 can be surely retained on the inside of the passages F2 and F3. Incidentally, the bottom wall portion 74*c* has openings 74*d* and 74*e* formed at positions opposed to the upper wall portions 74*a* and 74*b*.

The cable 61 extends from the module board 51 to the opposite side from the above-described cables 62 and 63 (see FIG. 9). As shown in FIG. 9 and FIG. 10, the cable holder 70 has a guide portion 76 in a lower portion of the cable holder 70, the guide portion 76 defining the position of the cable 61 in a region on the outside of an outer edge of the module board 51. That is, the guide portion 76 forms side walls of a passage F1 in which the cable 61 is disposed. In the present example, the guide portion 76 forms the passage F1 extending in one of the left direction and the right direction. The passage F1 in the present example extends in the right direction while bending at a plurality of positions. This shape of the guide portion 76 makes it possible to dispose the cable 61 while using a narrow space between other parts mounted on the main board 41, and to prevent interference between these parts and the cable 61. Incidentally, the guide portion 76 is disposed on the circuit board 40 (more specifically the main board 41).

As shown in FIG. 10, as with the guide portion 74, the guide portion 76 has upper wall portions 76*a* that partially cover the passage F1. Thereby, the cable 61 can be prevented from slipping out of the passage F1. In addition, as shown in FIG. 11, the guide portion 76 has a bottom wall portion 76*c* forming a bottom of the passage F1. Incidentally, the bottom wall portion 76*c* has openings 76*d* and 76*e* formed at positions opposed to the upper wall portions 76*a*. In addition, a projection 76*f* that is fitted in a hole formed in the main board 41 and which defines the position of the cable holder 70 and the main board 41 is formed at an end portion of the guide portion 76.

[Connecting Structures Between Circuit Boards]

Figure 12:
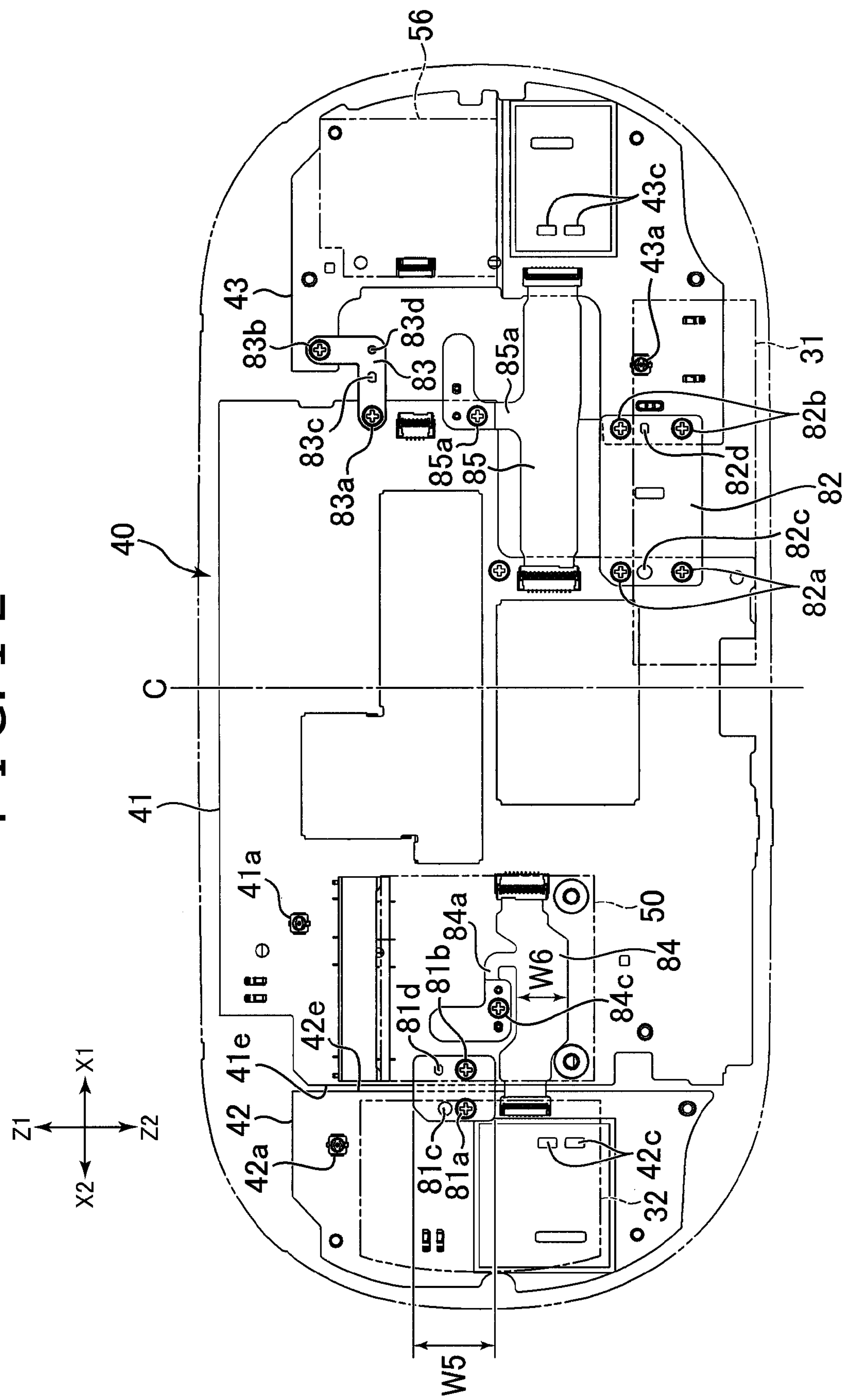
FIG. 12 is a rear view of the whole of the circuit board.

As described above, the circuit board 40 is divided into three circuit boards, and is formed by the main board 41, the right sub-board 42, and the left sub-board 43. FIG. 12 is a rear view of the boards 41, 42, and 43.

As shown in FIG. 12, the sub-boards 42 and 43 are each disposed so as to be adjacent to the main board 41. Specifically, the right sub-board 42 is disposed to the right of the main board 41, and the left sub-board 43 is disposed to the left of the main board 41. These boards are disposed in substantially a same plane. These three boards 41, 42, and 43 as a whole have a shape corresponding to an internal shape of the front housing 24. These boards 41, 42, and 43 are connected to each other through cables 84 and 85 including signal lines, as will be described later in detail.

A microprocessor (not shown) that controls the whole of the electronic device 10 and which performs image processing is mounted on the main board 41. In addition, a connector (not shown) into which a terminal of a cable for connecting an external device to the electronic device 10 is inserted is also attached to the main board 41. The main board 41 is located on the back surface side of the above-described display panel unit 2 (see FIG. 1).

The right sub-board 42 is located on the back surface side of the operating buttons 5 and the operating stick 7 described above (see FIG. 1). Switches pressed by projected portions 5*d* formed on the back surface of the operating buttons 5 are mounted on the surface of the right sub-board 42 which surface is opposed to the front panel 22. In addition, the left sub-board 43 is located on the back surface side of the cross key 6 and the operating stick 8 described above (see FIG. 1). Switches pressed by projected portions 6*d* formed on the back surface of the cross key 6 are mounted on the surface of the left sub-board 43 which surface is opposed to the front panel 22.

The main board 41 is a multilayer printed wiring board, and the number of layers of the main board 41 is larger than the number of layers of the right sub-board 42 and the number of layers of the left sub-board 43. Therefore, the weight of the electronic device 10 can be reduced as compared with a case where the whole of the circuit board 40 is a printed wiring board having the same number of layers as the main board 41. Incidentally, the sub-boards 42 and 43 may also be a multilayer printed wiring board.

As shown in FIG. 12, the electronic device 10 has flat metallic plates 81, 82, and 83. The metallic plates 81, 82, and 83 are for example members formed by press working from one metallic plate. The metallic plate 81 is attached to the surface of the main board 41 and the surface of the right sub-board 42. A ground pattern is formed on the surface of the main board 41 and on the surface of the right sub-board 42. These ground patterns are connected to each other by the metallic plate 81. The metallic plates 82 and 83 are attached to the surface of the main board 41 and the surface of the left sub-board 43. A ground pattern is also formed on the surface of the left sub-board 43. The ground pattern of the left sub-board 43 and the ground pattern of the main board 41 are connected to each other by the metallic plates 82 and 83. As described above, the communication module 50 connected to the antennas 31, 32, and 33 is connected to the main board 41. Ground impedance can be lowered by connecting the ground patterns of the three boards 41, 42, and 43 to each other through the metallic plates 81, 82, and 83. As a result, though the three boards 41, 42, and 43 are used, potential stability close to that in a case where one board is used can be obtained in the ground, and the reception sensitivity of the communication module 50 can be improved. Incidentally, on the surfaces of the boards 41, 42, and 43, the ground patterns are formed at positions where the metallic plates 81, 82, and 83 are attached, for example. Then, the ground patterns are connected to a ground layer as one of layers of the boards 41, 42, and 43. In addition, the ground patterns may be formed on substantially the whole area of the surfaces of the boards 41, 42, and 43.

The metallic plate 81 is attached to the main board 41 and the right sub-board 42 by screws 81*b* and 81*a*, respectively. In addition, the metallic plate 82 is attached to the main board 41 and the left sub-board 43 by screws 82*a* and 82*b*, respectively. In the present example, the metallic plate 82 is attached to the main board 41 by a plurality of screws (two screws in the present example) 82*a*, and is attached to the left sub-board 43 by a plurality of screws (two screws in the present example) 82*b*. Further, the metallic plate 83 is attached to the main board 41 and the left sub-board 43 by screws 83*a* and 83*b*, respectively. The use of the screws 81*a*, 81*b*, 82*a*, 82*b*, 83*a*, and 83*b* for these connections can increase contact pressure between the metallic plates 81, 82, and 83 and the ground patterns formed on the boards 41, 42, and 43, so that ground impedance is lowered easily.

In the present example, bosses 21*d* having screw holes formed therein into which screw holes the screws 81*a*, 81*b*, 82*a*, 82*b*, 83*a*, and 83*b* are screwed are formed on the frame portion 21*c* of the front housing 24 (see FIG. 3). The screws 81*a* and 81*b* press the metallic plate 81 and the boards 41 and 42 against the bosses 21*d*. Similarly, the screws 82*a*, 82*b*, 83*a*, and 83*b* press the metallic plates 82 and 83 and the boards 41 and 43 against the bosses 21*d*. This structure can further increase the contact pressure between the metallic plates 81, 82, and 83 and the ground patterns of the boards 41, 42, and 43.

Incidentally, the structure for fixing the metallic plates 81, 82, and 83 to the boards 41, 42, and 43 is not limited to this. For example, the metallic plates 81, 82, and 83 may be fixed to the circuit boards 41, 42, and 43 with bolts or solder.

Incidentally, as shown in FIG. 12, holes 81*c* and 81*d* are formed in the metallic plate 81. The boards 41 and 42 also have holes formed therein at positions corresponding to the holes 81*c* and 81*d*. Projections formed on the frame portion 21*c* are fitted into these holes. The positions of the main board 41 and the metallic plate 81 with respect to the front housing 24 are thereby defined. Similarly, holes 82*c* and 82*d* are formed in the metallic plate 82. The boards 41 and 43 also have holes formed therein at positions corresponding to the holes 82*c* and 82*d*. Then, projections formed on the frame portion 21*c* are fitted into these holes. Further, holes 83*c* and 83*d* are formed in the metallic plate 83. Projections formed on the frame portion 21*c* are fitted into these holes.

As shown in FIG. 12, an edge (right edge 41*e* in the present example) of the main board 41 is located along an edge (left edge 42*e* in the present example) of the right sub-board 42. The metallic plate 81 is disposed so as to straddle these edges 41*e* and 42*e*. The metallic plate 81 has a rectangular shape elongated in a direction (upward-downward direction in the present example) along these edges 41*e* and 42*e*. Therefore, a width of the metallic plate 81 in the upward-downward direction is larger than a width W5 of the metallic plate 81 in a direction perpendicular to the edges 41*e* and 42*e*, that is, the left-right direction. With this shape of the metallic plate 81, the impedance of the main board 41 and the right sub-board 42 is lowered easily. Incidentally, the width W5 of the metallic plate 81 in the present example is larger than a width W6 of a flat cable 84 to be described later.

As described above, the communication module 50 electrically connected to the main board 41 through the connector 55 is disposed on the main board 41 (see FIG. 3). A part (part located on the main board 41) of the metallic plate 81 is located in a gap between the communication module 50 and the main board 41, and is covered by the communication module 50. That is, in the present example, the metallic plate 81 partly overlaps the communication module 50 in a direction of thickness of the main board 41. The part of the metallic plate 81 which part overlaps the communication module 50 is attached to the main board 41 by the above-described screw 81*b*. According to such a layout of the metallic plate 81, ground noise (potential variation) near the communication module 50 is suppressed easily.

As described above, the electronic device 10 has the second antenna 32. The second antenna 32 is disposed on the back surface side of the right sub-board 42, and is connected to the communication module 50 through a circuit pattern formed on the right sub-board 42. As shown in FIG. 12, another part (part attached to the right sub-board 42) of the metallic plate 81 is located between the second antenna 32 and the right sub-board 42. That is, the metallic plate 81 partly overlaps the second antenna 32. According to this layout, ground noise (potential variation) near the second antenna 32 is suppressed easily.

The main board 41 and the right sub-board 42 are further connected to each other by the flexible flat cable 84. The cable 84 is disposed so as to extend in the left-right direction. Both ends of the cable 84 are connected respectively to a connector on the main board 41 and a connector on the right sub-board 42. The cable 84 includes signal lines. Signals are transmitted between the main board 41 and the right sub-board 42 through the signal lines. In the present example, as described above, the right sub-board 42 is located on the back surface side of the operating buttons 5. Input signals of these operating buttons are input to the microprocessor on the main board 41 through the cable 84. In addition, as shown in FIG. 6, the electronic device 10 in the present example includes a speaker 13R. Contacts 42*c* that come into contact with terminals of the speaker 13R are formed on the right sub-board 42. An audio signal is input from the main board 41 to the speaker 13R through the cable 84.

The cable 84 has a ground line. The ground line in the present example includes a bent line 84*a* bent at a midpoint of the cable 84. The bent line 84*a* has a larger width than the other signal lines. The bent line 84*a* is fixed to the ground pattern of the main board 41 by a screw 84*c*. In addition, the bent line 84*a* has a reinforcing plate at an end portion thereof. The reinforcing plate is attached to the main board 41 by the screw 84*c*. According to such a bent line 84*a*, connection strength between the ground line of the cable 84 and the ground pattern of the main board 41 can be increased. As a result, the occurrence of noise for signals transmitted and received through the antennas, which noise is caused by signals flowing through the cable 84, can be suppressed. In addition, because the bent line 84*a* is provided to the ground line of the cable 84, the position of the bent line 84*a* can be adjusted as appropriate at a time of design of the cable 84, and a degree of freedom of the attachment position of the ground line can be increased. Incidentally, in the present example, the cable 84 is adjacent to the metallic plate 81, and the bent line 84*a* is also covered by the communication module 50 as with the metallic plate 81.

As shown in FIG. 12, the metallic plates 82 and 83 stretched between the left sub-board 43 and the main board 41 are located so as to be separated from each other in the upward-downward direction. In the present example, the metallic plate 82 is attached to a lowermost portion of the left sub-board 43 and a lowermost portion of the main board 41. In addition, the metallic plate 83 is attached to an uppermost portion of the left sub-board 43 and an uppermost portion of the main board 41. The ground impedance of the main board 41 and the left sub-board 43 is lowered easily by thus greatly separating the positions of the metallic plates 82 and 83 from each other in the upward-downward direction. Incidentally, in the present example, the metallic plate 82 is a rectangular plate elongated in the left-right direction. The metallic plate 83 is a plate having substantially the shape of an L.

As shown in FIG. 12, the main board 41 and the left sub-board 43 are further connected to each other by the flexible flat cable 85. The cable 85 is disposed so as to extend in the left-right direction. Both ends of the cable 85 are connected respectively to a connector on the main board 41 and a connector on the left sub-board 43. The cable 85 includes signal lines. Signals are transmitted between the main board 41 and the left sub-board 43 through the signal lines. In the present example, the left sub-board 43 is located on the back side of the cross key 6. Input signals of the cross key are input to the microprocessor on the main board 41 through the cable 85. In addition, as shown in FIG. 6, the electronic device 10 in the present example includes a speaker 13L. Contacts 43*c* that come into contact with terminals of the speaker 13L are formed on the left sub-board 43. An audio signal is input from the main board 41 to the speaker 13L through the cable 85.

The cable 85 has a ground line. As shown in FIG. 12, as in the cable 84, the ground line of the cable 85 includes a bent line 85*a* bent at a midpoint of the cable 85 in a direction (upward in the present example) perpendicular to the extending direction of the cable 85. The bent line 85*a* has a larger width than the other signal lines. The bent line 85*a* is fixed to the ground pattern of the main board 41 by a screw 85*c*. According to such a bent line 85*a*, connection strength between the ground line of the cable 85 and the ground of the main board 41 can be increased. The above-described first antenna 31 is disposed in the lower left portion of the electronic device 10, and is located close to the cable 85. Providing the bent line 85*a* thicker than the other signal lines to the cable 85 can suppress the occurrence of noise for signals transmitted and received through the first antenna 31, which noise is caused by signals flowing through the cable 85. In addition, because the bent line 85*a* is provided to the ground line of the cable 85, the position of the bent line 85*a* can be adjusted as appropriate at a time of design of the cable 85, and a degree of freedom of the attachment position of the ground line can be increased.

As described above, the metallic plates 82 and 83 are located so as to be separated from each other in the upward-downward direction. As shown in FIG. 12, the cable 85 is located between the metallic plates 82 and 83. The first antenna 31 is disposed so as to overlap the metallic plate 82 in the front-rear direction. The first antenna 31 is located on the back surface side of the metallic plate 82. According to such a layout, the occurrence of noise for signals transmitted and received through the first antenna 31, which noise is caused by signals flowing through the cable 85, can be suppressed also by the metallic plate 82.

[Two Electronic Devices Having Difference in Communicating Function]

As described above, the electronic device 10 has a communicating function using the mobile telephone network. In the following, description will be made of an electronic device group including an electronic device having a substantially similar structure to that of the electronic device 10 but different from the electronic device 10 in terms of whether or not the communicating function is provided and the electronic device 10.

Figure 13:
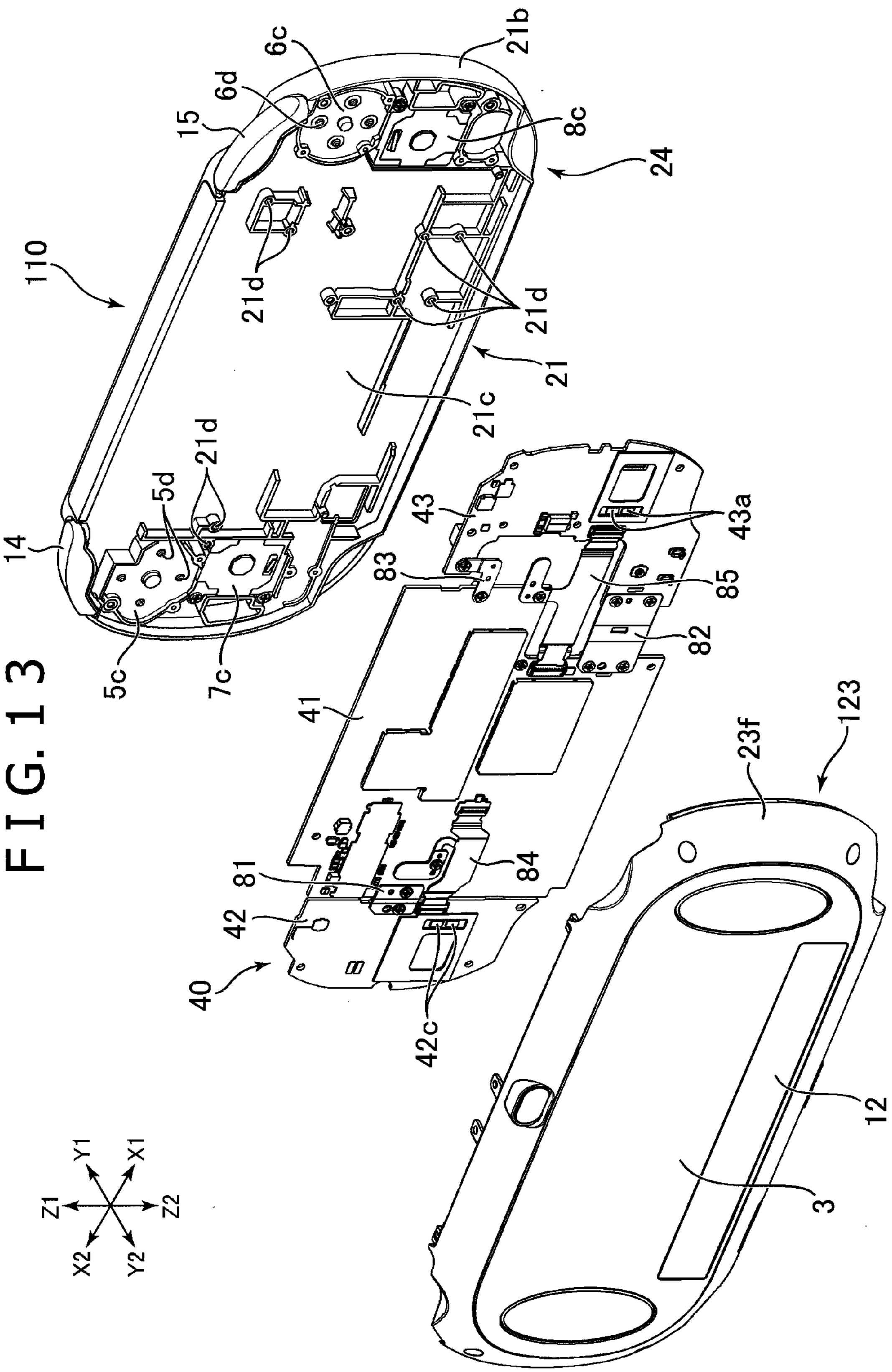
FIG. 13 is an exploded perspective view of another portable type electronic device than the electronic device shown in FIGS. 1 to 12. The electronic device shown in FIG. 13 has common functions with the electronic device shown in FIGS. 1 to 12 other than a communicating function using a mobile telephone network among the functions possessed by the electronic device shown in FIGS. 1 to 12.
Figure 14:
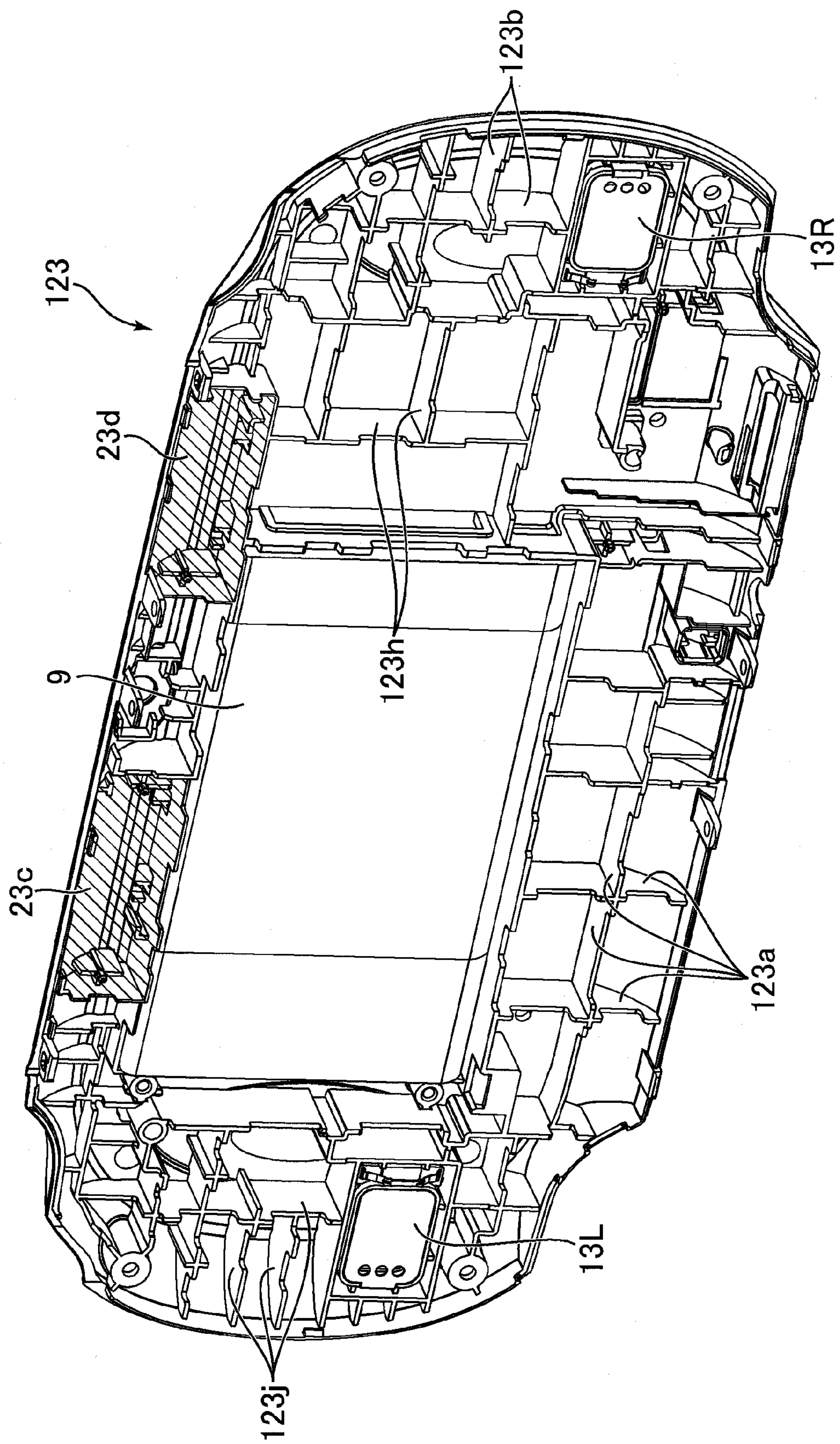
FIG. 14 is a perspective view of the inside of a back housing of the electronic device shown in FIG. 13.

FIG. 13 is an exploded perspective view of a portable type electronic device 110 forming the electronic device group together with the electronic device 10. FIG. 14 is a perspective view facing the inside of a back housing 123 provided to the electronic device 110. The electronic device 110 does not have the above-described communicating function using the mobile telephone network (which communicating function will hereinafter be referred to as an additional communicating function) among the functions of the electronic device 10. The electronic device 110 has common functions other than the additional communicating function with the electronic device 10.

As shown in FIG. 13, the electronic device 110 includes a circuit board 40, the back housing 123, and a front housing 24.

As described above, the electronic device 10 includes the antennas 31 and 32 and the communication module 50 as parts for the additional communicating function. In addition, as shown in FIG. 3, the electronic device 10 includes a receiving device 56 as a part for the additional communicating function. The receiving device 56 receives an IC card (for example a USIM (Universal Subscriber Identity Module) card) used in communications by the antennas 31 and 32 and the communication module 50. The IC card is assigned a unique identifying number. The number is stored in a memory circuit provided to the IC card. The receiving device 56 in the present example has a board 56*a* and a receiving plate 56*b*. The board 56*a* is disposed in such an attitude as to face the circuit board (left sub-board 43 in the present example), and is connected to the circuit board 40 (main board 41 in the present example) through a flat cable. The receiving plate 56*b* functions as a mount for mounting the IC card, and is slidable to the outside of the electronic device (in the left direction in the present example) with respect to the board 56*a*. The user places the IC card on the receiving plate 56*b*, and slides the receiving plate 56*b* to the board 56*a*.

As described above, the housing 20 of the electronic device 10 includes the front housing 24 covering the front side of the circuit board 40 and the back housing 23 covering the back side of the circuit board 40. The antennas 31 and 32, the communication module 50, and the receiving device 56 are each disposed between the circuit board 40 and the back housing 23. Specifically, as shown in FIG. 3, the communication module 50 and the receiving device 56 are attached to the back surface of the circuit board 40. In the present example, the communication module 50 is attached to the back surface of the main board 41, and the receiving device 56 is attached to the back surface of the left sub-board 43. The antennas 31 and 32 are retained by the back housing 23 (see FIG. 6).

As shown in FIG. 13 and FIG. 14, the electronic device 110 is not provided with the antennas 31 and 32, the communication module 50, and the receiving device 56 for the additional communicating function. The structure on the front side of the circuit board 40 is common to the electronic device 110 and the electronic device 10. That is, the front housing 24 provided to the electronic device 110 is common to the front housing 24 shown in FIG. 1 and FIG. 3. Hence, as with the front housing 24 of the electronic device 10, the front housing 24 provided to the electronic device 110 is provided with a display panel unit 2 and operating members 5, 6, 7, and 8. Being common in this case means that the front housings 24 provided to the two electronic devices 10 and 110 and the parts provided to the front housings 24 have a same size and a same shape, and the front housing 24 of one electronic device can also be used as the front housing 24 of the other electronic device. Thus concentrating the parts for the additional communicating function on the back surface side of the circuit board 40 in the electronic device 10 can achieve the commonality of the structure on the front side of the circuit board 40 between the electronic device 110 and the electronic device 10. According to such electronic devices 10 and 110, the number of parts that can be commonly used is increased, and manufacturing cost thereof can be reduced, as compared with a structure in which the parts for the additional communicating function are distributed on the front side and the back side of the circuit board 40.

Incidentally, as shown in FIG. 13, the electronic device 110 is not provided with the connector 55 connected to the module board 51 of the communication module 50 either. In addition, as shown in FIG. 3, the back housing 23 of the electronic device 10 is provided with a lid portion 23*j*. The position of the lid portion 23*j* corresponds to the receiving device 56 in the outer peripheral portion of the back housing 23. The user can open the lid portion 23*j* and slide the receiving plate 56*b* in the left direction. On the other hand, as shown in FIG. 13, the lid portion 23*j* is not formed in the back housing 123 of the electronic device 110.

As shown in FIG. 6, the back housing 23 of the electronic device 10 has spaces formed therein to house the antennas 31 and 32, the communication module 50, and the receiving device 56. Specifically, as described above, the first housing space 23*a* for housing the first antenna 31 and the second housing space 23*b* for housing the second antenna 32 are formed in the back housing 23. Further, a module housing space 23*h* for housing the communication module 50 and a receiving device housing space 23*i* for housing the receiving device 56 are formed in the back housing 23. On the other hand, as shown in FIG. 14, the back housing 123 of the electronic device 110 has a structure for reinforcing the back housing 123 at positions corresponding to these housing spaces 23*a*, 23*b*, 23*h*, and 23*i*. In the present example, the back housing 123 has a rib 123*a* and a rib 123*b* at the position corresponding to the first housing space 23*a* and the position corresponding to the second housing space 23*b*, respectively. In addition, the back housing 123 has a rib 123*h* and a rib 123*i* at the position corresponding to the module housing space 23*h* and the position corresponding to the receiving device housing space 23*i*, respectively. The ribs 123*a*, 123*b*, 123*h*, and 123*i* have the shape of a wall standing on the inner surface of the back housing 123.

As described above, the first antenna 31 and the second antenna 32 have the bases 31*a* and 32*a* to which the film-shaped antenna main bodies 31*b* and 32*b* are laminated. The bases 31*a* and 32*a* are members molded of resin, and have substantially the shape of a box opened toward the front housing 24. On the other hand, the above-described ribs 123*a* and 123*b* are molded integrally with the back housing 123 molded of resin. Therefore, a difference in weight between the electronic device 10 and the electronic device 110 which difference results from the fact that the electronic device 110 does not have the antennas 31 and 32 can be reduced.

As shown in FIG. 3 and FIG. 12, the communication module 50 and the receiving device 56 in the electronic device 10 are located on the opposite sides from each other with the center C in the left-right direction interposed in between. Therefore, a difference in weight balance in the left-right direction between the electronic device 110, which does not include the communication module 50 and the receiving device 56, and the electronic device 10 can be reduced. Incidentally, in the present example, the communication module 50 is located on the right side of the center C, and the receiving device 56 is located on the left side of the center C.

In the present example, the communication module 50 has the IC chips mounted on both surfaces of the module board 51 and the shield plates 53 and 54 covering the IC chips. In addition, the communication module 50 in the present example is provided with the above-described cable holder 70. Meanwhile, the board 56*a* of the receiving device 56 is smaller than the module board 51, and the receiving plate 56*b* is molded of resin. The communication module 50 therefore has a larger weight than the receiving device 56. As shown in FIG. 12, the communication module 50 is located closer to the center C in the left-right direction than the receiving device 56. That is, a distance from the center C to the communication module 50 is smaller than a distance from the center C to the receiving device 56. According to such a layout, the position of the center of gravity of the communication module 50 and the receiving device 56 is closer to the center C in the left-right direction than in a structure in which the communication module 50 and the receiving device 56 are disposed at equal distances from the center C. As a result, the difference in weight balance in the left-right direction between the electronic device 110 and the electronic device 10 can be reduced as compared with the case where the communication module 50 and the receiving device 56 are disposed at equal distances from the center C in the electronic device 10.

As described above, the battery 9 of the electronic device 10 is offset in one of the left direction and the right direction in the back housing 23. In the present example, the battery 9 is located so as to be offset in the left direction with respect to the center C (see FIG. 5). As shown in FIG. 14, the electronic device 110 also has a battery 9 housed in the back housing 123. The position of the battery 9 in the back housing 123 is the same as the position of the battery 9 in the back housing 23. The battery 9 is offset in the left direction in the back housing 123. As with the battery 9, the communication module 50 and the receiving device 56 in the electronic device 10 are also offset in the left direction as a whole. In the present example, the receiving device 56 is disposed along a left edge of the back housing 123, and the communication module 50 is located so as to be separated from a right edge of the back housing 23 in the left direction. According to such a layout of the communication module 50 and the receiving device 56, a direction in which the center of gravity of the electronic device 10 is offset from the center C is the same as a direction in which the center of gravity of the electronic device 110 is offset from the center C.

As described above, the communication module 50 has the module board 51 separate from the main board 41. The module board 51 is attached to the main board 41 by the screws 59*a* (see FIG. 10). According to such a structure, a circuit pattern for functions common to the electronic device 10 and the electronic device 110 is formed on the main board 41 easily as compared with a structure in which the IC chips possessed by the communication module 50 is soldered directly to the main board 41.

In addition, as shown in FIG. 3, the receiving device 56 also has the board 56*a* separate from the left sub-board 43. The board 56*a* is attached to the left sub-board 43 by a screw 56*c*. According to this structure, a circuit pattern for functions common to the electronic device 10 and the electronic device 110 is formed on the left sub-board 43 easily as compared with a structure in which an IC card slot and the like are soldered directly to the left sub-board 43.

As shown in FIG. 14, the electronic device 110 has speakers 13L and 13R in the left portion and the right portion, respectively, of the electronic device 110. The speakers 13L and 13R are disposed on the back side of the circuit board 40 (the left sub-board 43 and the right sub-board 42 in the present example), and are retained by the back housing 123. As shown in FIG. 6, the electronic device 10 also has the speakers 13L and 13R in the left portion and the right portion, respectively, of the electronic device 10. These speakers 13L and 13R are also disposed on the back sides of the left sub-board 43 and the right sub-board 42, respectively. In the electronic device 10, the speaker 13L on the left side is disposed in the back housing 23, while the speaker 13R on the right side is retained by the second antenna 32. That is, a space for housing the speaker 13R is formed in the base 32*a* of the second antenna 32. According to such a structure, the speaker 13R can be housed within the electronic device 10 without the electronic device 10 being made larger than the electronic device 110.

SUMMARY OF PRESENT EMBODIMENT

As described above, in the electronic device 10, the first antenna 31 is disposed closer to the rear touch panel 4, of the display panel 2*a* and the rear touch panel 4, than to the display panel 2*a* in the front-rear direction of the housing 20. In addition, the first antenna 31 is located so as to be offset from the rear touch panel 4 in a direction perpendicular to the front-rear direction of the housing 20 so that at least a part of the first antenna 31 does not overlap the rear touch panel 4 in the front-rear direction of the housing 20. According to such a layout of the first antenna 31, both of an adverse effect from the display panel 2*a* and an adverse effect from the rear touch panel 4 on the reception sensitivity of the first antenna 31 can be reduced.

In addition, the rear touch panel 4 has a smaller size than the display panel 2*a*. According to this structure, the display panel 2*a* has a part that does not overlap the rear touch panel 4 in the front-rear direction. As a result, the layout of the first antenna 31 can be facilitated while a sufficient size of the display panel 2*a* is secured.

In addition, the rear touch panel 4 is offset upward with respect to the display panel 2*a*, and the first antenna 31 is located downward with respect to the rear touch panel 4. According to this layout, an antenna having a large width in the upward-downward direction can be used as the first antenna 31.

In addition, the rear touch panel 4 is located on the outer surface of the housing 20. According to this structure, an adverse effect from the rear touch panel 4 on the first antenna 31 can be reduced.

In addition, the first antenna 31 is located between the operating members 5 and 7 on the right side and the operating members 6 and 8 on the left side in the left-right direction, and is disposed so as to be offset downward with respect to the rear touch panel 4. According to this layout, the first antenna 31 is not covered by the hands of the user while the user is operating the operating members 5 and 7 on the right side and the operating members 6 and 8 on the left side. Therefore good reception sensitivity can be obtained.

In addition, the first antenna 31 is disposed so as to be offset downward from the rear touch panel 4, and the second antenna 32 is disposed so as to be offset in the right direction from the rear touch panel 4. According to this layout, the possibility of both of the first antenna 31 and the second antenna 32 being covered by the hands of the user can be reduced.

In addition, the position of the battery 9 is offset in the left direction with respect to the center C in the left-right direction of the housing 20. According to this layout, when the user holds the electronic device 10 with one hand, the user often holds the left side part of the electronic device 10 in which the battery 9 is disposed. The second antenna 32 is not covered by the hand when the user holds the left side part of the electronic device 10. Thus, good reception sensitivity can be obtained.

In addition, the third antenna 33 and the fourth antenna 34 are disposed on the opposite side from the first antenna 31 with the rear touch panel 4 interposed in between. According to this layout, the distance between these antennas can be increased. Thus, good reception sensitivity is obtained easily.

It is to be noted that in regard to the layout of the antennas, the present invention is not limited to the electronic device 10 described above, but is susceptible of various changes.

For example, the first antenna 31 may be disposed closer to the display panel 2*a* than to the rear touch panel 4, and disposed so as to be offset from the display panel 2*a* so that at least a part of the first antenna 31 does not overlap the display panel 2*a* in the front-rear direction. In this case, the size of the display panel 2*a* may be smaller than the size of the rear touch panel 4.

In addition, the rear touch panel 4 may be offset downward with respect to the display panel 2*a*. In this case, the first antenna 31 may be disposed so as to be offset upward with respect to the rear touch panel 4. In this case, the third antenna 33 and the fourth antenna 34 may be disposed so as to be offset downward with respect to the rear touch panel 4.

In addition, the second antenna 32 may be disposed in the left direction of the rear touch panel 4. In this case, the battery 9 may be offset in the right direction with respect to the center C in the left-right direction of the housing 20.

In the electronic device 10, the cables 62 and 63 are arranged so as to straddle the IC chip 52. In the above example, the connectors 51*b* and 51*c* to which one end portions of the cables 62 and 63 are connected are provided to the module board 51, and the cables 62 and 63 extend to the opposite side from the connectors 51*b* and 51*c* with the IC chip 52 interposed in between. In addition, the electronic device 10 includes the cable holder 70. The cable holder 70 has the retaining portion 71 that is located on the opposite side of the IC chip 52 from the circuit board 51 and which retains the cables 62 and 63. According to this structure, the cables 62 and 63 can be laid while a space above the IC chip 52 is used, and interference between the cables 62 and 63 and other parts provided to the electronic device 10 can be prevented.

In addition, the cable holder 70 has the two engaging portions 72 engaged with the outer edges of the module board 51. According to this structure, the cable holder 70 can be attached to the module board 51 easily.

In addition, the cable holder 70 includes the main body portion 77 having such a shape as to cover the module board 51 and having the retaining portion 71. An opening (opening on the inside of the rectangular frame 77*b* in the above description) is formed in the main body portion 77. According to this structure, the heat of the IC chip 52 is emitted to the outside easily.

In addition, the cables 62 and 63 extend beyond an outer edge of the module board 51, and the cable holder 70 has the guide portion 74 that is located on the outside of the outer edge of the module board 51 and which defines the positions of the cables 62 and 63 on the circuit board 40. According to this structure, interference between electronic parts mounted on the circuit board 40 and the cables 62 and 63 can be prevented.

In addition, the electronic device 10 includes the circuit board 40 (main board 41 in the present example) that is disposed on the opposite side from the cables 62 and 63 with the module board 51 interposed in between and which is larger than the module board 51. According to this structure, the cables 62 and 63 are disposed so as to straddle the IC chip 52. Thus, a degree of freedom of the layout of electronic parts on the circuit board 40 can be increased.

In regard to the cable retaining structure, the present invention is not limited to the electronic device 10 described above, but is susceptible of various changes.

For example, in the above description, the two cables 62 and 63 are retained by the retaining portion 71 of the cable holder 70. However, the number of cables retained by the retaining portion 71 may be one.

In addition, the electronic device 10 described above is a portable type electronic device. However, the present invention may be applied to electronic devices that are not of a portable type.

In addition, the cable holder 70 has the guide portions 74 and 76. However, the guide portions 74 and 76 do not necessarily need to be provided to the cable holder 70.

In the electronic device 10, the ground pattern of the main board 41 and the ground pattern of the right sub-board 42 are connected to each other by the metallic plate 81, and the ground pattern of the main board 41 and the ground pattern of the left sub-board 43 are connected to each other by the metallic plates 82 and 83. According to this structure, ground impedance can be lowered while a plurality of circuit boards are used.

In addition, the metallic plate 81 is attached to the main board 41 and the right sub-board 42 by the screws 81*a* and 81*b*, and the metallic plates 82 and 83 are attached to the main board 41 and the left sub-board 43 by the screws 82*a*, 82*b*, 83*a*, and 83*b*. According to this attachment structure, contact pressure between the metallic plates 81, 82, and 83 and the ground patterns formed on the boards 41, 42, and 43 can be increased, and thus ground impedance is lowered easily.

In addition, the main board 41 and the right sub-board 42 respectively include the edges 41*e* and 42*e* located along each other. In addition, the width W5 of the metallic plate 81 in a direction along the edges 41*e* and 42*e* is larger than the width of the metallic plate 81 in a direction perpendicular to the edges 41*e* and 42*e*. According to this shape, the impedance of the main board 41 and the right sub-board 42 can be further lowered.

In addition, the number of layers of the main board 41 is larger than the number of layers of the right sub-board 42 and the number of layers of the left sub-board 43. According to this structure, the cost of the electronic device 10 can be reduced as compared with a structure in which the whole of the circuit board 40 is formed with a number of layers which number is the same as the number of layers of the main board 41.

The communication module 50 that faces the main board 41 and which is electrically connected to the main board 41 is disposed on the main board 41. A part of the metallic plate 81 is located in a gap between the main board 41 and the communication module 50, and is attached to the main board 41. According to such a layout of the metallic plate 81, ground noise (potential variation) near the communication module 50 is suppressed easily.

The left sub-board 43 is located in the left direction with respect to the main board 41, and the metallic plates 82 and 83 attached to the left sub-board 43 and the main board 41 are located so as to be separated from each other in the upward-downward direction. According to this structure, the impedance of the main board 41 and the left sub-board 43 is lowered easily.

In addition, the flat cable 85 that connects the left sub-board 43 and the main board 41 to each other is disposed between the metallic plates 82 and 38. According to this structure, the occurrence of noise caused by signals flowing through the cable 85 can be suppressed by the metallic plates 82 and 83.

In addition, the flat cables 84 and 85 include a ground line. According to this structure, ground potential variations in the main board 41, the right sub-board 42, and the left sub-board 43 are further suppressed easily. In addition, because flat cables are used as the cables 84 and 85, the thickness of the ground lines is adjusted easily.

In regard to the connecting structures between the circuit boards, the present invention is not limited to the electronic device 10 described above, but various changes may be made.

For example, in the above description, the circuit board 40 includes the main board 41, the right sub-board 42, and the left sub-board 43. However, the circuit board 40 may be formed by the main board 41 and the right sub-board 42 or by the main board 41 and the left sub-board 43.

In addition, in the above description, the flat cables 84 and 85 include the bent lines 84*a* and 85*a*. However, the flat cables 84 and 85 do not necessarily need to include the bent lines 84*a* and 85*a*.

As described above, in the electronic device 10, the parts for the additional communicating function such as the antennas 31 and 32, the communication module 50, the IC card receiving device 56, and the like are disposed between the back housing 23 and the circuit board 40. According to this, the front housing 24 can be made common in the electronic device 110, which does not have the additional communicating function, and the electronic device 10, and manufacturing cost thereof can be reduced.

In the electronic device 10, the communication module 50 and the receiving device 56 are located on the opposite sides from each other with the center C in the left-right direction of the electronic device 10 interposed in between. According to such a layout, a difference in weight balance in the left-right direction between the electronic device 110, which does not include the communication module 50 and the receiving device 56, and the electronic device 10 can be reduced.

In addition, the communication module 50 has a larger weight than the receiving device 56, and is located closer to the center C in the left-right direction of the electronic device 10 than the receiving device 56. According to this structure, the difference in weight balance in the left-right direction between the electronic device 110, which does not include the communication module 50 and the receiving device 56, and the electronic device 10 can be reduced.

In addition, in the electronic device 10, the communication module 50 has the module board 51 separate from the circuit board 40. According to this structure, a circuit pattern for functions common to the electronic device 10 and the electronic device 110 is formed on the circuit board 40 easily as compared with a structure in which the IC chips possessed by the communication module 50 is soldered directly to the circuit board 40.

In the electronic device 10, the receiving device 56 has the circuit board 56*a* separate from the circuit board 40. According to this structure, a circuit pattern for functions common to the electronic device 10 and the electronic device 110 is formed on the circuit board 40 easily as compared with a structure in which an IC chip slot is soldered directly to the circuit board 40.

In the electronic device 10, the spaces 23*a*, 23*b*, 23*h*, and 23*i* for housing the antennas 31 and 32, the communication module 50, and the receiving device 56, respectively, are formed in the back housing 23.

According to this structure of the electronic device 10, the ribs 123*a*, 123*b*, 123*h*, and 123*i* for reinforcing the back housing 123 can be formed in parts corresponding to the spaces 23*a*, 23*b*, 23*h*, and 23*i* in the electronic device 110 of the type not including the antennas 31 and 32, the communication module 50, and the receiving device 56.

In the electronic device 10, the plurality of parts for the additional communicating function, which parts are not included in the electronic device 110, are disposed between the back housing 23 and the circuit board 40. In addition, the front housing 24 of the electronic device 10 and the front housing 24 of the electronic device 110 are common to each other. According to this structure, the front housing 24 is common in the electronic device 10 and the electronic device 110. Thus, the manufacturing cost of these two electronic devices can be reduced.

In addition, the back housing 23 of the electronic device 10 has the spaces 23*a*, 23*c*, 23*h*, and 23*i* for housing the antennas 31 and 32, the communication module 50, and the receiving device 56. The back housing 123 of the electronic device 110 has a structure for reinforcing the back housing 123 in positions corresponding to the spaces 23*a*, 23*c*, 23*h*, and 23*i*. According to this structure, a housing having sufficient strength is obtained also in the electronic device 110, which does not include the antennas 31 and 32, the communication module 50, and the receiving device 56.

The antennas 31 and 32 of the electronic device 10 include the bases 31*a* and 32*a* formed of resin. The back housing 123 of the electronic device 110 has the ribs 123*a* and 123*b* formed of resin as a structure for reinforcing the back housing 123. According to this structure, a difference between the weight of the electronic device 10 and the weight of the electronic device 110 can be reduced.

In addition, in a method of manufacturing the electronic device 10 and the electronic device 110, a plurality of parts for the additional communicating function which parts are not included in the electronic device 110 (that is, the antennas 31 and 32 and the like) are disposed between the back housing 23 and the circuit board 40 of the electronic device 10. Then, a housing common to the front housing 24 of the electronic device 110 is used as the front housing 24 of the electronic device 10. According to this manufacturing method, the front housing 24 is common in the electronic device 10 and the electronic device 110. Thus the manufacturing cost of these two electronic devices can be reduced.

The electronic device group including the electronic device 10 and the electronic device 110 is susceptible of various changes.

For example, in the above description, the electronic device 10 includes the antennas 31 and 32, the communication module 50, and the receiving device 56 as a plurality of parts not included in the electronic device 110. However, the plurality of parts are not limited to these parts. Another part may not be included in the electronic device 110.

The invention claimed is:

1. A portable type electronic device comprising:

a housing;

a first touch panel disposed on a first surface side of the housing;

a second touch panel disposed on a second surface side of the housing, wherein the first surface is parallel to the second surface; and an antenna housed in the housing;

the antenna being disposed closer to the second touch panel than the first touch panel in a front-rear direction of the housing;

the antenna being located so as to be offset from the second touch panel in a direction perpendicular to the front-rear direction of the housing so that at least a part of the antenna does not overlap the second touch panel in the front-rear direction of the housing, wherein the second touch panel has a smaller size than the first touch panel in an upward-downward direction of the housing, wherein the second touch panel is offset in an upward direction or a downward direction with respect to the first touch panel, and the antenna is located in a direction opposite the upward direction or the downward direction with respect to the second touch panel; and the antenna is laminated to a surface of any one of a box shape base and an outer portion of the housing.

2. The portable type electronic device according to claim 1, wherein the second touch panel has a smaller size than the first touch panel in width in an upward-downward direction, the second touch panel is offset in one of an upward direction or a downward direction with respect to the first touch panel, and the antenna is located in the other of the upward direction or the downward direction with respect to the second touch panel.

3. The portable type electronic device according to claim 1, wherein the second touch panel is located on an outer surface of the housing.

4. The portable type electronic device according to claim 1, further comprising:

an operating member located on a right side of the first touch panel and capable of being operated by a user; and an operating member located on a left side of the first touch panel and capable of being operated by the user;

wherein a position of the antenna in a left-right direction of the housing being between the operating member on the right side and the operating member on the left side, and the antenna being disposed so as to be offset in one of an upward direction or a downward direction with respect to the second touch panel.

5. The portable type electronic device according to claim 1, comprising:

a first antenna located so as to be offset from the second touch panel in one of an upward direction or a downward direction, the first antenna functioning as the antenna; and a second antenna located so as to be offset from the second touch panel in one of a right direction or a left direction.

6. The portable type electronic device according to claim 5, further comprising:

a battery housed in the housing;

a position of the battery being offset in the other of the right direction or the left direction with respect to a center of the housing.

7. The portable type electronic device according to claim 1, comprising:

a first antenna located so as to be offset from the second touch panel in one of an upward direction or a downward direction, the first antenna functioning as the antenna; and a third antenna disposed on an opposite side from the first antenna with the second touch panel interposed in between.

* * * * *